United States Patent [19]

Mitsuishi et al.

[11] Patent Number: 5,381,556
[45] Date of Patent: Jan. 10, 1995

[54] SEMICONDUCTOR DEVICE HAVING EXTERNALLY PROGRAMMABLE MEMORY

[75] Inventors: Naoki Mitsuishi, Kodaira; Atsushi Hirose, Matsudo, both of Japan

[73] Assignees: Hitachi, Ltd.; Hitachi Microcomputer System Ltd., Tokyo, Japan

[21] Appl. No.: 48,410

[22] Filed: Apr. 15, 1993

[30] Foreign Application Priority Data

Apr. 30, 1992 [JP] Japan .................. 4-137672

[51] Int. Cl.⁶ .............................................. G06F 9/24
[52] U.S. Cl. ................................. 395/800; 364/232.8; 364/244.6; 364/965.5
[58] Field of Search .................. 365/94; 395/500, 775, 395/800, 375

[56] References Cited

U.S. PATENT DOCUMENTS 4,783,737 11/1988 Ara et al. .............................. 395/425
4,972,375 11/1990 Ueno ..................................... 365/226
5,243,701 9/1993 Muramatsu .......................... 395/325

Primary Examiner—David Y. Eng
Attorney, Agent, or Firm—Fay, Sharpe, Beall, Fagan, Minnich & McKee

[57] ABSTRACT

A semiconductor device is provided for implementing a single-chip microcomputer or the like, which microcomputer is compatible with a plurality of programmable ROM writing schemes. The device enhances the functionality and system flexibility of the single-chip microcomputer or the like while reducing development period and design and evaluation steps of a system incorporating the above-mentioned microcomputer. The single-chip microcomputer incorporates a programmable ROM (PROM), having a PROM mode for writing the programmable ROM by using a general-purpose ROM writer. The unit is provided with a write control signal for selectively specifying a writing scheme in the PROM mode to selectively switch between numbers and/or combinations of address signal and/or activation control signals to be supplied to the programmable ROM.

27 Claims, 16 Drawing Sheets

SOCKET ADAPTOR PIN ASSIGMENT FOR 256kilo TYPE

SOCKET ADAPTOR PIN ASSIGMENT FOR 1mega TYPE

SOCKET ADAPTOR PIN ASSIGMENT FOR 256kilo TYPE

FIG. 15

| | MD0 | MD1 | STBY | CONT P94 | RES | T1 | T2 | T12 |
|---|---|---|---|---|---|---|---|---|
| PROM MODE (256kilo TYPE) | L | L | L | L | VPP | L | H | H |
| PROM MODE (1mega TYPE) | L | L | L | H | VPP | H | L | H |

FIG. 16

PROM: 32kilo BYTE/MICROCOMPUTER: 256kilo TYPE PROM MODE

| | MICROCOMPUTER INPUTS | | | | PROM INPUTS | |
|---|---|---|---|---|---|---|
| | CE P91 | OE P92 | ADDRESS TERMINALS P1, P2 | DATA TERMINAL P3 | ECE | EOE |
| PROGRAM | L | H | ADDRESS INPUT | DATA INPUT | L | H |
| VERIFY | H | L | ADDRESS INPUT | DATA OUTPUT | H | L |
| PROGRAMMING INHIBITED | H | H | ADDRESS INPUT | Hz | H | H |
| | L | L | | | L | L |

Hz: HIGH IMPEDANCE

FIG. 17

PROM: 32kilo BYTE/MICROCOMPUTER: 1mega TYPE PROM MODE

|  | MICROCOMPUTER INPUTS | | | | | PROM INPUTS | |
|---|---|---|---|---|---|---|---|
|  | CE P91 | OE P92 | PGM P93 | ADDRESS TERMINALS P1, P2 | DATA TERMINAL P3 | ECE | EOE |
| PROGRAM | L | H | L | ADDRESS INPUT | DATA INPUT | L | H |
| VERIFY | L | L | H | ADDRESS INPUT | DATA OUTPUT | H | L |
| PROGRAMMING INHIBITED | H | H | H | ADDRESS INPUT | Hz | H | H |
|  | L | H | H |  |  | H | H |
|  | H | L | H |  |  | H | H |
|  | H | H | L |  |  | H | H |
|  | H | L | L |  |  | H | H |
|  | L | L | L |  |  | H | H |

Hz: HIGH IMPEDANCE

FIG. 18

PROM: 48kilo BYTE/MICROCOMPUTER: 256kilo TYPE PROM MODE

|  | MICROCOMPUTER INPUTS | | | | PROM INPUTS | | |
|---|---|---|---|---|---|---|---|
|  | CE P91 | OE P92 | ADDRESS TERMINALS P1, P2 | DATA TERMINAL P3 | ECE | EOE | EPGM |
| PROGRAM | L | H | ADDRESS INPUT | DATA INPUT | L | H | L |
| VERIFY | L | L | ADDRESS INPUT | DATA OUTPUT | L | L | H |
| PROGRAMMING INHIBITED | H | H | ADDRESS INPUT | Hz | H | H | H |
|  | H | L |  |  | H | H | H |

Hz: HIGH IMPEDANCE

FIG. 19

PROM: 48kilo BYTE/MICROCOMPUTER: 1mega TYPE PROM MODE

| | MICROCOMPUTER INPUTS | | | | | PROM INPUTS | | |
|---|---|---|---|---|---|---|---|---|
| | CE P91 | OE P92 | PGM P93 | ADDRESS TERMINALS P1, P2 | DATA TERMINAL P3 | ECE | EOE | EPGM |
| PROGRAM | L | H | L | ADDRESS INPUT | DATA INPUT | L | H | L |
| VERIFY | L | L | H | ADDRESS INPUT | DATA OUTPUT | L | L | H |
| PROGRAMMING INHIBITED | H | H | H | ADDRESS INPUT | Hz | H | H | H |
| | L | H | H | | | L | H | H |
| | H | L | H | | | H | L | H |
| | H | H | L | | | H | H | L |
| | H | L | L | | | H | L | L |
| | L | L | L | | | L | L | L |

Hz: HIGH IMPEDANCE

FIG. 20

PROM: 48kilo BYTE/MICROCOMPUTER: 1mega TYPE PROM MODE

| | MICROCOMPUTER INPUTS | | | | |
|---|---|---|---|---|---|
| | CE P91 | OE P92 | PGM P93 | ADDRESS TERMINALS P1, P2 | DATA TERMINAL P3 |
| PROGRAM | L | H | L | ADDRESS INPUT | DATA INPUT |
| VERIFY | L | L | H | ADDRESS INPUT | DATA OUTPUT |
| PAGE DATA LATCH | H | L | H | ADDRESS INPUT | DATA INPUT |
| PAGE PROGRAM | H | H | L | ADDRESS INPUT | Hz |
| PROGRAMMING INHIBITED | H | H | H | ADDRESS INPUT | Hz |
| | L | H | H | | |
| | H | L | L | | |
| | L | L | L | | |

Hz: HIGH IMPEDANCE

SEMICONDUCTOR DEVICE HAVING EXTERNALLY PROGRAMMABLE MEMORY

BACKGROUND OF THE INVENTION

The present invention relates to a semiconductor integrated circuit device and, more particularly, to a technology suitably used for a single-chip microcomputer incorporating a programmable ROM (Read Only Memory) and having a PROM (Programmable Read Only Memory) mode for writing data to the programmable ROM.

As is known, there is a microcomputer of single-chip type having a CPU (Central Processing Unit) of stored program type, a ROM for storing a program, a RAM (Random Access Memory) for storing data, and input/output circuits all formed on a same semiconductor substrate, thereby reducing system production cost while enhancing system reliability. It is also known that replacing a ROM built in such a microcomputer with a programmable ROM such as an EPROM (Electrically Programmable ROM) and providing the PROM mode for writing the programmable ROM by means of a general-purpose ROM writer allow a user to write and/or modify programs, shortening system development period. To this end, the microcomputer is linked to the ROM writer through a predetermined socket adaptor to put activation control signals in a predetermined combination, which in turn selectively puts the microcomputer in the PROM mode.

The single-chip microcomputer incorporating the programmable ROM and having the PROM mode is described in "H8/320, H8/325, H8/324, H8/323, And H8/322 Series Hardware Manual" of Hitachi America, Ltd., December 1990, pages 1 through 17 and 197 through 207, by way of example. The single-chip microcomputer incorporating the EPROM is also disclosed in Japanese Patent Laid-open Nos. JP-A-61-51695 (U.S. Pat. No. 4,701,886) and JP-A-62-99856 (U.S. Pat. No. 4,807,114).

OBJECTS AND SUMMARY OF THE INVENTION

A general-purpose ROM writer provides a plurality of writing schemes according to types and storage sizes of programmable ROMs. A programmable ROM incorporated in a single-chip microcomputer is written with data by selectively using a writing scheme corresponding to the ROM's type and storage size. For an EPROM provided by Hitachi, Ltd., for example, there are two types of writing schemes; a 256K-bit type for an EPROM of a storage size less than 256K bits and a 1M-bit type for an EPROM of a storage size of 1M bits or more. Consequently, if a programmable ROM to be incorporated in the microcomputer has a storage size not more than 32K bytes (viz., 32K×8 bits), it is written by the 256K-bit type scheme; if the programmable ROM has a storage size of 48K bytes (48K×8 bits) or more, it is written by the 1M-bit type scheme.

With a conventional single-chip microcomputer incorporating a programmable ROM, a data input/output condition in the PROM mode is fixedly set in accordance with the writing scheme of the programmable ROM. Therefore, a socket adaptor that links a ROM writer with a microcomputer is prepared in two types according to the programmable ROM writing schemes. That is, the single-chip microcomputer incorporating a 32KB programmable ROM allows to write it only through the 256K-bit writing scheme, while the single-chip microcomputer incorporating a 48KB programmable ROM allows to write it only through the 1M-bit writing scheme. This increases technological burden on the user side, while degrading functionality and systems flexibility of the single-chip microcomputer containing the programmable ROM. Moreover, the above-mentioned prior-art arrangement makes it difficult to transport know-how between microcomputers containing programmable ROMs having the same CPU and input/output control but different storage sizes, thereby increasing system development period and the number of system design and evaluation processes.

Therefore, we have examined a case of developing a plurality of PROM-based single-chip microcomputers each having an identical CPU and input/output circuit and incorporating a ROM and a RAM (Random Access Memory) with a ROM and/or RAM size being different from one single-chip microcomputer to another. Increasing the storage size of the PROM increase a physical area of a corresponding semiconductor integrated circuit, leading to increased fabrication cost and product price. Consequently, a user can choose from the above-mentioned multiple single-chip microcomputers an optimum one for his or her application system. For example, when the user develops both high-end and low-end application systems, most of a user program can be shared between both application systems because of the identical CPU and input/output circuit. A program for the low-end application system is created by removing unnecessary portions from a high-end application system program. This reduces the ROM storage size of a single-chip microcomputer to which the low-end application system is applied. Therefore, in developing such single-chip microcomputers respectively having ROM storage sizes of 48KB and 32KB, either the 1M-bit EPROM writing scheme is applied to both microcomputers or the 1M-bit EPROM writing scheme is applied to the microcomputer of 48KB ROM storage size while the 256K-bit EPROM writing scheme is applied to the microcomputer of 32KB ROM storage size. However, we have identified following problems in both above-mentioned approaches. That is, in the former approach, or application of the 1M-bit EPROM writing scheme to both single-chip microcomputers, only a 48KB PROM memory array can be deleted by 16KB (48KB minus 32KB) to make read/write circuits or the like identical, simultaneously performing design and evaluation of the 32KB and 48KB PROMs and those of the single-chip microcomputers to which they are installed. However, this setup requires the user to be careful not to write more than 256K-bit data to the single-chip microcomputer whose ROM storage size is 32K bytes, thus increasing user's technological burden. In the latter approach, performing the different PROM writing schemes on the single-chip microcomputers while their CPUs and input/output circuits remaining identical requires to individually design and evaluate the microcomputers, also increasing the user's burden.

It is therefore an object of the present invention to provide a semiconductor device such as a single-chip microcomputer that is compatible with a plurality of programmable ROM writing schemes.

Another important object of the present invention is to enhance functionality and systems flexibility of the single-chip microcomputer incorporating the programmable ROM to reduce development period and the number of design and evaluation processes of a system incorporating the microcomputer.

The above and further objects and novel features of the invention will more fully appear from the following detailed description when the same is read in connection with the accompanying drawings. It is to be expressly understood, however, that the drawings are for the purpose of illustration only and is not intended as a definition of the limits of the invention.

A typical invention disclosed by the present application is outlined as follows. A semiconductor device such as the single-chip microcomputer incorporating the programmable ROM is provided with a write control signal for selectively specifying ROM writing schemes in the PROM mode to provide a capability of selectively switching between numbers and/or combinations of address signals and/or activation control signals supplied to the incorporated programmable ROM.

According to the above-mentioned setup, a single-chip microcomputer or the like that supports a plurality of program ROM writing schemes can be implemented regardless of the type and storage size of the programmable ROM built in the single-chip microcomputer. As a result, user's technological burden can be mitigated while the functionality and systems flexibility of the single-chip microcomputer or the like incorporating the programmable ROM are enhanced to reduce development period and the number of design and evaluation processes of an entire system including the microcomputer.

BRIEF DESCRIPTION OF THE DRAWINGS

FIG. 15 is a diagram illustrating an operating mode setting condition for an embodiment of the single-chip microcomputer of FIG. 1;

FIG. 16 is a diagram illustrating an operating mode setting condition for an embodiment in which the programmable ROM of FIG. 2 is constituted by a 32KB EPROM and the microcomputer is of 256K-bit type and has the PROM mode;

FIG. 17 is a diagram illustrating an operating mode setting condition for an embodiment in which the programmable ROM of FIG. 2 is constituted by the 32KB EPROM and the microcomputer is of 1M-bit type and has the PROM mode;

FIG. 18 is a diagram illustrating an operating mode setting condition for an embodiment in which the programmable ROM of FIG. 2 is constituted by a 48KB EPROM and the microcomputer is of 256K-bit type and has the PROM mode;

FIG. 19 is a diagram illustrating an operating mode setting condition for an embodiment in which the programmable ROM of FIG. 2 is constituted by the 48KB EPROM and the microcomputer is of 1M-bit type and has the PROM mode; and FIG. 20 is a diagram illustrating an operating mode setting condition for an embodiment in which the programmable ROM of FIG. 2 is constituted by the 48KB EPROM and the microcomputer is of 1M-bit type and has the PROM mode.

DESCRIPTION OF THE PREFERRED EMBODIMENTS

Figure 1:
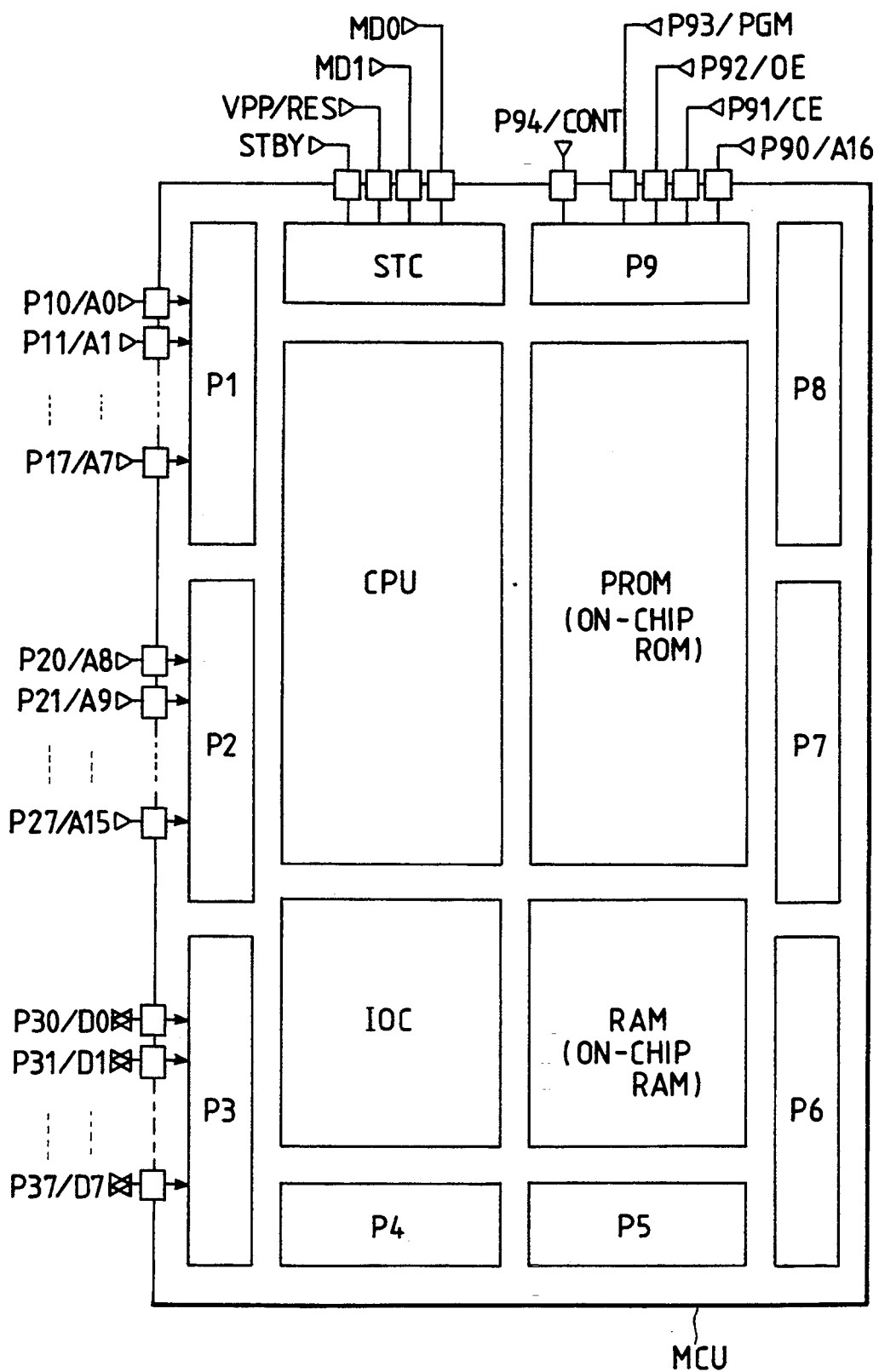
FIG. 1 is a block diagram of a first embodiment of the single-chip microcomputer according to the present invention.

FIG. 1 is a block diagram illustrating the first embodiment of the single-chip microcomputer unit (MCU) according to the present invention and FIG. 15 shows the operating mode setting condition for the embodiment of the single-chip microcomputer. Referring to these drawings, the constitution and operation of the microcomputer practiced as the above-mentioned embodiment will be outlined below. It should be noted that circuit elements constituting each of blocks shown in FIG. 1 are all formed on a single semiconductor substrate such as a silicon single crystal by means of known semiconductor integrated circuit fabrication technologies. It should also be noted that, of input/output signals and circuits constituting the microcomputer and a programmable ROM (Read Only Memory), those not directly related to the present invention are not shown in the following drawings.

Referring to FIG. 1, the single-chip microcomputer practiced as the above-mentioned embodiment comprises a central processing unit (CPU) of a so-called stored-program type, an on-chip programmable ROM (PROM) and an on-chip random access memory (RAM), both serving as data storage means, linked to the above-mentioned CPU through system buses (an address bus, a data bus, and a control bus), not shown, and an input/output circuit (IOC). The CPU is controlled in steps by a program stored in the programmable ROM to perform predetermined arithmetic and logic processing and supervises and controls other portions of the microcomputer.

The programmable ROM comprises an electrically programmable ROM (EPROM) having a storage size of 32KB or 48KB but not limited thereto to store the program and fixed data necessary for controlling the CPU. The RAM comprises a static RAM for example to temporarily store operating results supplied by the CPU and control data. The input/output circuit (IOC) provides a plurality of input/output channels to supervise and control data transfer between a variety of input/output devices externally connected to the microcomputer and the CPU or the RAM. It should be noted that the IOC is assumed to be a device peripheral to the CPU and comprises a 16-bit free-running timer, two 8-bit timers, and a serial communication unit.

The microcomputer practiced as the above-mentioned embodiment further comprises nine input/output ports P1 through P9 which provide interface with external devices, and one status controller (STC). The input/output port P1 is connected to eight external terminals P10 through P17 which provide address input terminals A0 through A7. Likewise, the input/output port P2 is connected to eight external terminals P20 through P27 which provide address input terminals A8 through A15. The input/output port P3 is connected to eight external terminals P30 through P37 which provide data input/output terminals D0 through D7. And the input/output port P9 is connected to five external terminals P90 through P94 which respectively provide an address input terminal A16, a chip enable signal input terminal CE, an output enable signal input terminal OE, a program signal input terminal PGM, and a write control signal input terminal CONT. It should be noted that other input/output ports P4 through P8, not shown, are also connected to respective external terminals. The status controller is connected to four external terminals, that is, mode control signal input terminals MD0 and MD1, a reset signal input terminal RES, and a standby signal input terminal STBY.

The above-mentioned status controller includes a mode control circuit for determining an operating mode of the above-mentioned microcomputer unit (MCU) based on combinations of signal levels on the above-mentioned input terminals MD0, MD1, and STBY. This mode control circuit determines the signal levels of the input terminals MD0, MD1, and STBY to put the microcomputer MCU in one of operating modes, mode 1 through mode 4, as listed in a table below:

| Mode No. | MD0 | MD1 | STBY | Description |
|---|---|---|---|---|
| Mode 1 | 1 | 0 | — | Expanded mode with on-chip ROM disable |
| Mode 2 | 0 | 1 | — | Expanded mode with on-chip ROM enable |
| Mode 3 | 1 | 1 | — | Single-chip mode |
| Mode 4 | 0 | 0 | 0 | PROM mode |

It should be noted that signals on these input terminals are adapted to latch, at a rising edge of the reset signal RES, in predetermined bits of a mode control register in the mode control circuit.

The mode 1 and mode 2 are used to expand an address space of the microcomputer MCU and permit access to an off-chip RAM or ROM. It should be noted that, in the mode 1, an on-chip ROM of the microcomputer MCU is not placed in the address space, while, in the mode 2, the on-chip ROM is placed there. Unlike the modes 1 and 2, the mode 3 does not expand the address space of the microcomputer MCU; in this mode, the microcomputer MCU is used as a microcomputer system. The mode 4 is the program mode of the on-chip ROM, or the PROM mode. In this mode, the CPU is disconnected from the system bus to make the on-chip ROM accessible, or programmable, from outside the microcomputer MCU. That is, when viewed from outside the microcomputer MCU, only the address space (or address area) of the on-chip ROM appears.

With the above-mentioned embodiment, the microcomputer MCU has the above-mentioned PROM mode in which the programmable ROM is written by a general-purpose PROM writer in two selectively specifiable writing schemes. That is, as shown in the above-mentioned table and FIG. 15, the microcomputer MCU is put in the PROM mode when the mode control signals MD0 and MD1 and the standby signal STBY are all set to a Low (L) level. As shown in FIG. 15, if the write mode control signal CONT is Low, the programmable ROM is written by the PROM writer in the 256K-bit writing scheme; if it is High, the ROM is written in the 1M-bit writing scheme. Although, as mentioned above, 32KB or 48KB is selectively specified for the storage size of the on-chip programmable ROM according to a particular system configuration, the writing schemes in the microcomputer's PROM mode can be set without being aware of the storage size of the programmable ROM.

When the microcomputer is in the PROM mode, a write voltage VPP such as +12.5 V is applied to the reset signal input terminal RES. When the 256K-bit writing scheme is used, internal control signals T1 and T2 to be described later are Low and High respectively on the programmable ROM. When the 1M-bit writing scheme is used, the signals T1 and T2 are High and Low respectively. An internal control signal 12 is High in both 256K-bit and 1M-bit writing schemes and goes Low when the microcomputer is in a normal operating mode (mode 1, mode 2 or mode 3) or outside the PROM mode.

The above-mentioned internal control signal T1 has the same signal level as the write mode control signal CONT which is used for selecting one of the writing schemes. That is, when the write control signal CONT goes Low, the internal control signal T1 also goes Low. Conversely, when the CONT goes High, the T1 also goes High.

The above-mentioned internal control signal T2 has a signal level which is inversion of a signal level of the CONT. That is, when the CONT goes Low, the T2 goes High; when the CONT goes High, the T2 goes Low.

The above-mentioned internal control signal T12 has a signal level that is a result of an OR operation between the internal control signals T1 and T2. That is, the signal T12 indicates that the on-chip PROM is in the write mode (or the programming mode).

Each of the internal control signals T1, T2, and T12 can be constituted by a circuit in the above-mentioned input/output port 9.

It should be noted that the internal control signal T12 may be provided by using a signal which is output when the above-mentioned mode control circuit in the state controller STC indicates the PROM mode.

Meanwhile, a semiconductor substrate (or a chip) on which the microcomputer MCU practiced as the above-mentioned embodiment of the present invention is formed is typically sealed in a DIP (Dual In-line Package) having a window for ultraviolet radiation. When the microcomputer is in the 256K-bit type PROM mode, the microcomputer package is plugged in a socket of the PROM writer through a socket adaptor of 256K-bit type shown in FIG. 6 to be described later. When the microcomputer is in the 1M-bit type PROM mode, the microcomputer package is plugged in the socket through a socket adaptor of 1M-bit type shown in FIG. 7 to be described later. As will be evident, the data and program stored in the programmable ROM of the microcomputer are erased all at once when a predetermined level of ultraviolet ray is radiated onto it through the package window.

Figure 2:
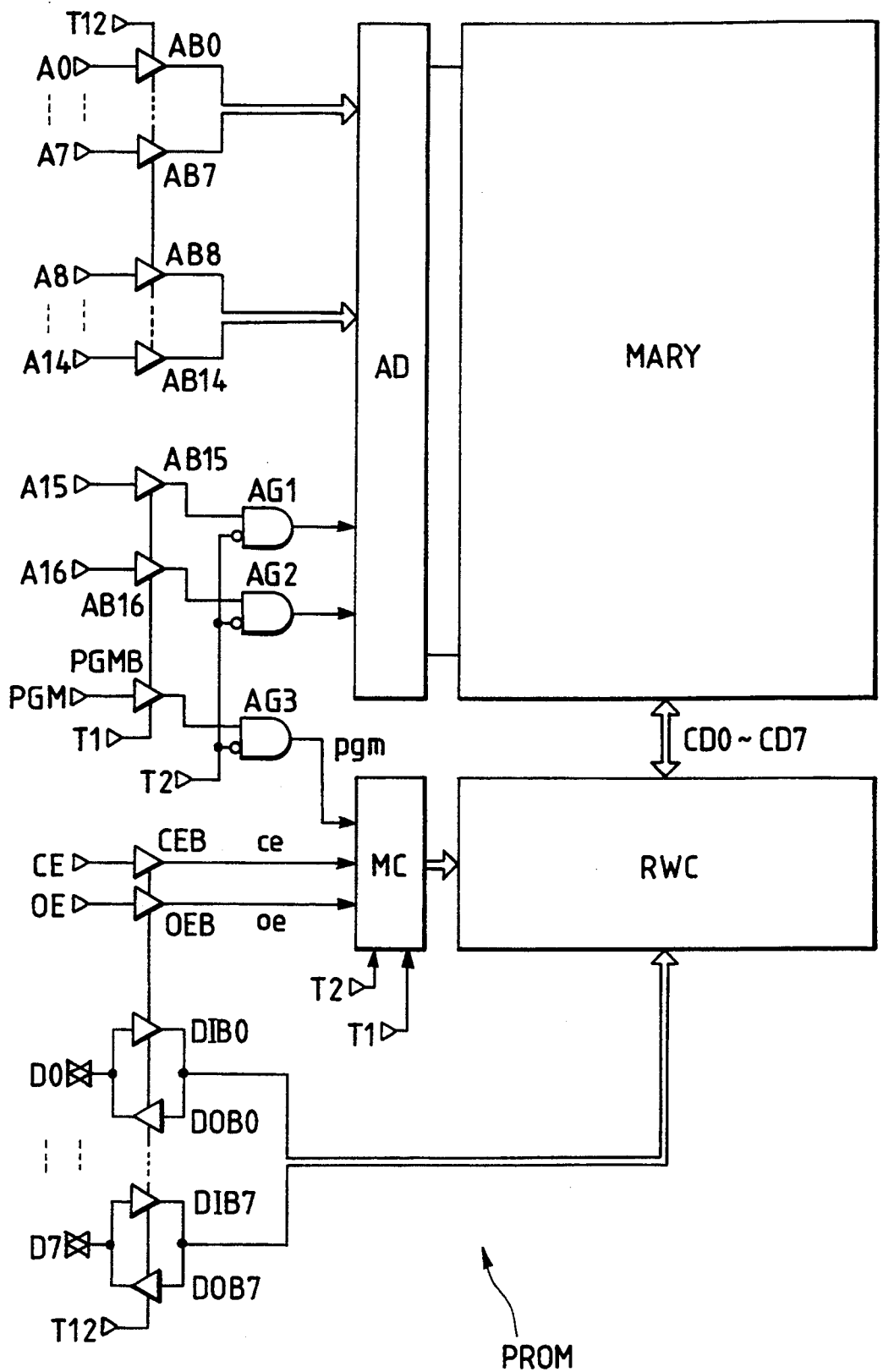
FIG. 2 is a block diagram of a first embodiment of the programmable ROM incorporated in the single-chip microcomputer of FIG. 1.
Figure 3:
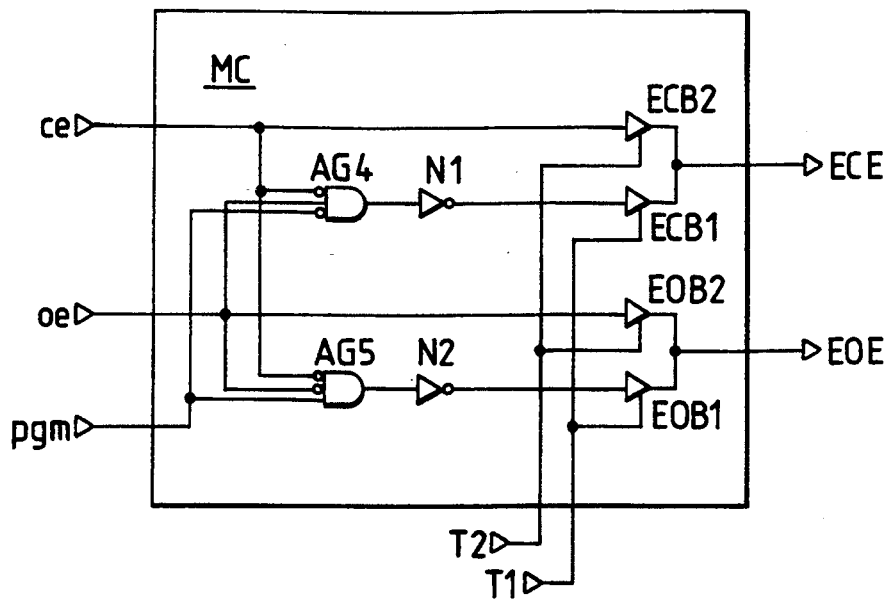
FIG. 3 is a partial circuit diagram illustrating an embodiment of a memory control circuit with the programmable ROM of FIG. 2 constituted by a 32KB EPROM.
Figure 4:
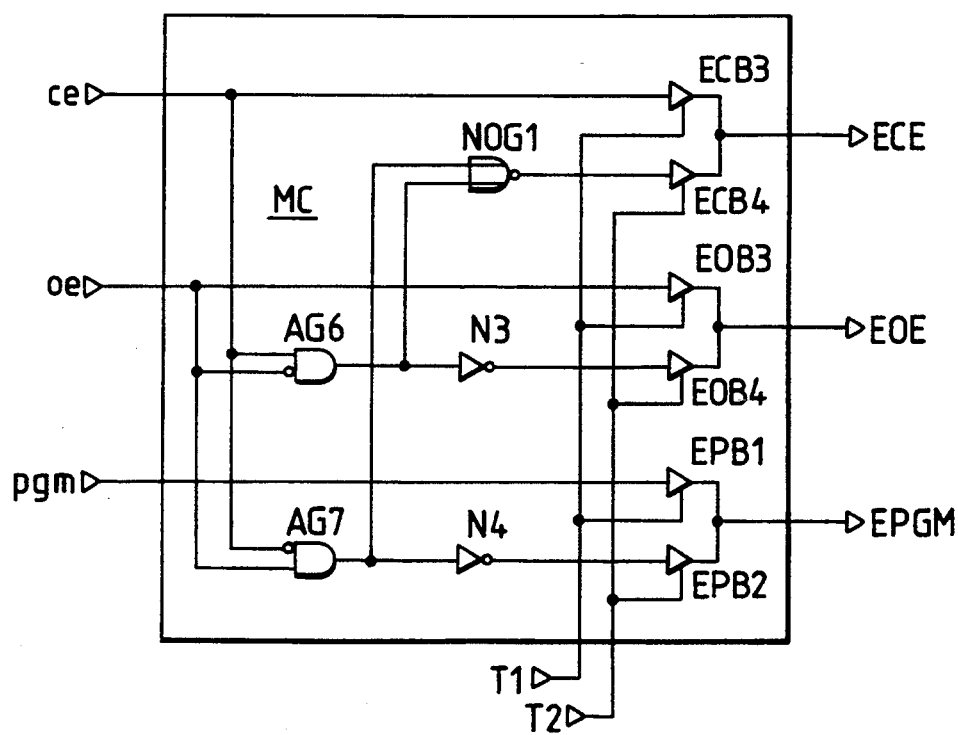
FIG. 4 is a partial circuit diagram illustrating an embodiment of the memory control circuit with the programmable ROM of FIG. 2 constituted by a 48KB EPROM.
Figure 5:
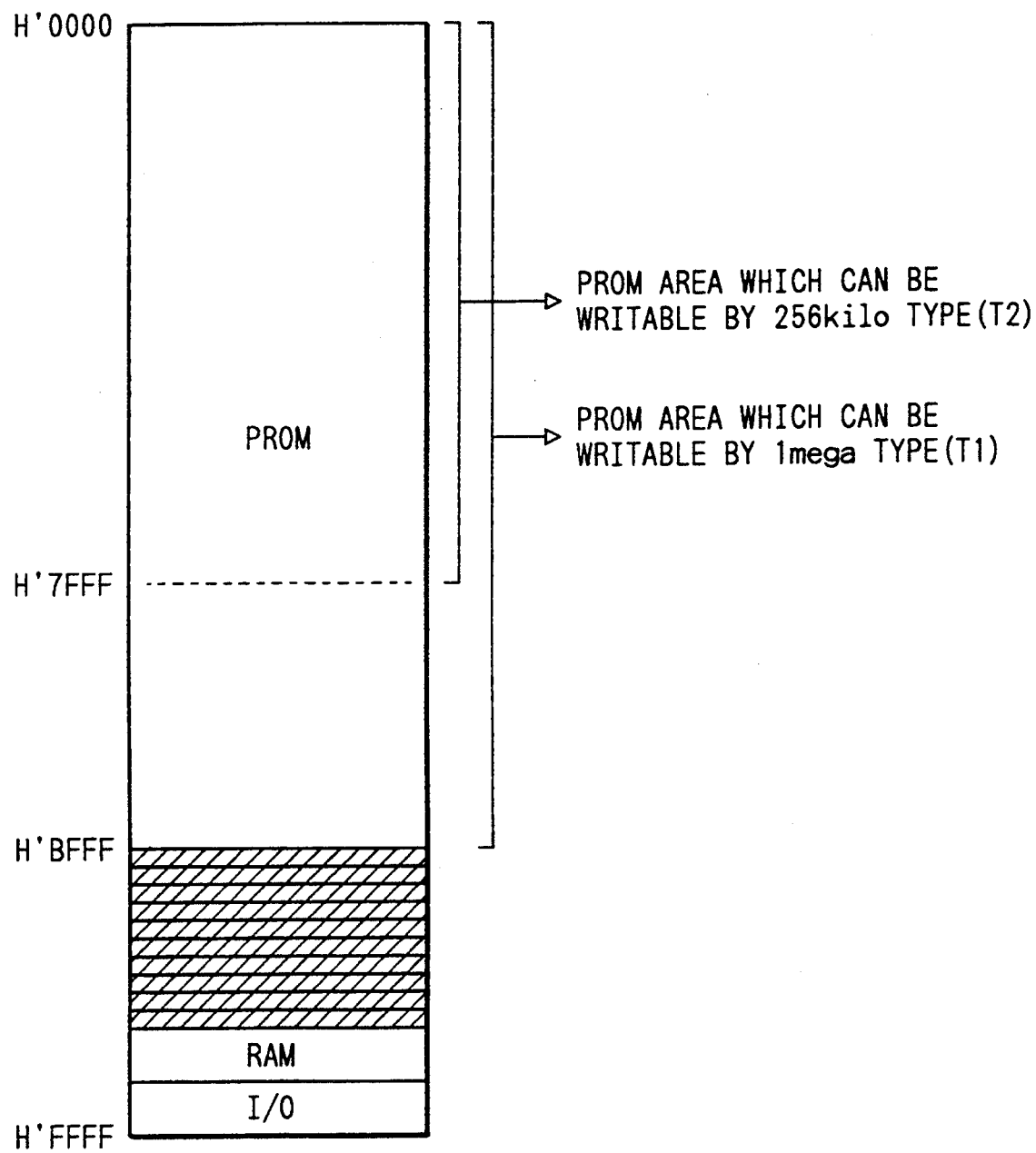
FIG. 5 is an address assignment diagram illustrating an embodiment of a microcomputer incorporating the programmable ROM of FIG. 2.

FIG. 2 is a block diagram illustrating the first embodiment of the programmable ROM built in the single-chip microcomputer of FIG. 1. FIG. 3 is a partial circuit diagram of the embodiment of the memory control circuit MC with the programmable ROM of FIG. 2 constituted by a 32KB EPROM. FIG. 4 is a partial circuit diagram of the embodiment of the memory control circuit MC with the programmable ROM constituted by a 48KB EPROM. FIG. 5 is an address map of the embodiment of the programmable ROM of FIG. 2. FIGS. 16 and 17 illustrate the operating mode setting conditions for the above-mentioned embodiment with the programmable ROM constituted by a 32KB EPROM and the microcomputer being in the PROM modes of 256K-bit and 1M-bit types respectively. FIGS. 18 and 19 illustrate the operating mode setting conditions for the above-mentioned embodiment with the programmable ROM constituted by a 48KB EPROM and the microcomputer being in the PROM modes of 256K-bit and 1M-bit types respectively. Referring to these drawings, the constitution and operation of the programmable ROM practiced as the above-mentioned embodiment will be outlined and its features will be described below. It should be noted that, in the address map shown below, the address space of the microcomputer is hexadecimally represented in units of four bits of an address signal.

Now, referring to FIG. 2, the programmable ROM is basically constituted by a memory array MARY in which memory cells of FAMOS (Floating-gate Avalanche injection MOS) type are arranged in a lattice. Drains of a predetermined number of memory cells aligned along a same column are commonly connected to a corresponding data line; gates of a predetermined number of memory cells aligned along a same row are commonly connected to a corresponding word line.

Word lines constituting the memory array MARY are connected to an address decoder AD to be selectively made High. Data lines are selected by the address decoder AD in units of eight to be connected to a corresponding unit circuit of a read/write circuit RWC through common data lines CD0 through CD7. The address decoder AD is supplied with 15-bit address signals A0 through A14 via input buffers AB0 through AB7 and AB8 through AB14 and is selectively supplied with 2-bit address signals A15 and A16 via input buffers AB15 and AB16 and AND gates AG1 and AG2. Controls terminals of the input buffers AB0 through AB14 are commonly supplied with the internal control signal T12. Controls terminals of the input buffers AB15 and AB16 are commonly supplied with the internal control signal T1. The AND gates AG1 and AG2 are supplied at one of their input terminals with output signals of the input buffers AB15 and AB16 respectively; other input terminals of these AND gates are commonly supplied with the internal control signal T2. It should be noted that, as mentioned above, the internal control signal T1 and T2 are selectively made High when the microcomputer is put in the 1M-bit and 256K-bit type PROM modes respectively; the internal control signal T12 is selectively made High when the microcomputer is put in the PROM mode of either type of writing scheme.

The input buffers AB0 through AB14 transmit the 15-bit address signals A0 through A14 input via the input ports P1 and P2 to the address decoder AD when the microcomputer is put in the 256K-bit or 1M-bit type PROM mode and the internal control signal T12 is made High. The input buffers AB15 and AB16 transmit the 2-bit address signals A15 and A16 input via the input/output ports P2 and P9 to one of the input terminals of the AND gates AG1 and AG2 respectively when the microcomputer is put in the 1M-bit type PROM mode and the internal control signal T1 is made High. The AND gates AG1 and AG2 transmit the address signals A15 and A16 to the address decoder AD when the internal control signal T2 is made Low, or on condition that the microcomputer is not put in the PROM mode of 256K-bit type.

As a result, the programmable ROM practiced as the above-mentioned embodiment has, as shown in FIG. 5, a 32KB address space H'0000 through H'7FFF selectively specified by the 15-bit address signals A0 through A14 when the microcomputer is put in the PROM mode of 256K-bit type and a 48KB address space H'0000 through H'BFFF selectively specified by the 17-bit address signals A0 through A16 when the microcomputer is put in the PROM mode of 1M-bit type. It should be noted that a predetermined address space adjacent to an end address H'FFFF is allocated to the RAM and input/output circuit IOC. It should also be noted that, as described above, the programmable ROM is constituted by an EPROM having a storage size of 32KB or 48KB, putting the activation control signals in different combinations. The combinations of the activation control signals are varied by the memory control circuit MC to be described later.

Next, the read/write circuit RWC will be described. The read/write circuit RWC has eight unit circuits corresponding to the common data lines CD0 through CD7, each unit circuit containing one write amplifier and one read amplifier. An input terminal of each write amplifier is connected to an output terminal of a corresponding input buffer DIB0 to DIB7, the output terminal in turn being connected to a corresponding common data lines CD0 to CD7. An input terminal of each read amplifier is connected to a corresponding common data line CD0 to CD7, an output terminal of which is in turn connected to an input terminal of a corresponding output buffer DOB0 to DOB7. The input terminals of the input buffers DIB0 through DIB7 and the output terminals of the output buffers DOB0 through DOB7 are commonly connected to the substantial data input/output terminals D0 through D7 respectively. Control terminals of the input buffers DIB0 through DIB7 and output buffers DOB0 through DOB7 are commonly supplied with the internal control signal T12.

Further, the read/write circuit RWC is supplied with a predetermined internal control signal from the memory control circuit MC. The memory control circuit MC is supplied with the internal control signals T1 and T2, selectively supplied with a programming signal PGM from an input buffer PGMB to provide the activation control signal via an AND gate AG3, and supplied with a chip enable signal CE and output enable signal OE, which also provide activation control signals via input buffers CEB and OEB respectively. The internal control signal T1 is applied to a control terminal of the input buffer PGMB whose output signal is supplied to one of input terminals of the AND gate AG3. Another input terminal of the AND gate AG3 is supplied with the internal control signal T2 and control terminals of the input buffers CEB and OEB are supplied with the internal control signal T12. Thus, the programming signal PGM is selectively transmitted to the memory control circuit MC as an internal control signal pgm when the microcomputer is put in the PROM mode of 1M-bit type. The chip enable signal CE and the output enable signal OE are selectively transmitted to the memory control circuit MC as internal control signals ce and oe respectively when the microcomputer is put in the PROM mode of either 256K-bit type or 1M-bit type.

As shown in FIG. 3, the memory control circuit MC includes two AND gates AG4 and AG5 which receive the internal control signals ce, oe, and pgm in a predetermined combination when the programmable ROM is constituted by a 32KB EPROM. A first input terminal of the AND gate AG4 is supplied with an inverted signal of the internal control signal ce. A second input terminal and a third input terminal of the AND gate AG4 are respectively supplied with a non-inverted signal of the internal control signal oe and an inverted signal of the internal control signal pgm. A first input terminal of the AND gate AG5 is supplied with an inverted signal of the internal control signal ce. A second input terminal and a third input terminal of the AND gate AG5 are respectively supplied with an inverted signal of the internal control signal oe and a non-inverted signal of the internal control signal pgm. Accordingly, an output signal of the AND gate AG4 is selectively made High if both the internal control signals ce and pgm are made Low and the internal control signal oe is made High. An output signal of the AND gate AG5 is selectively made High if both the internal control signals ce and oe are made Low and the internal control signal pgm is made High.

The output signal of the AND gate AG4 is transmitted through an inverter N1 and an output buffer ECB1 to the read/write circuit RWC as an internal control signal ECE which provides a substantial activation control signal of the programmable ROM. The output signal of the AND gate AG5 is transmitted through an inverter N2 and an output buffer EOB1 to the read/write circuit RWC as an internal control signal EOE which provides a substantial activation control signal of the programmable ROM. Output terminals of the output buffers ECB1 and EOB1 are commonly supplied with the internal control signal T1. An output terminal of the output buffer ECB1 is commonly connected to an output terminal of an output buffer ECB2. An output terminal of the output buffer EOB1 is commonly connected to an output terminal of an output buffer EOB2. The internal control signal ce is applied to an input terminal of the output buffer ECB2 and the internal control signal oe to an input terminal of the output buffer EOB2. The internal control signal T2 is commonly applied to control terminals of these output buffers ECB2 and EOB2.

Now, referring to FIG. 16, when the microcomputer is put in the PROM mode of 256K-bit type and the internal control signal T2 is made High, the internal control signal ECE and EOE, which provide the substantial activation control signals of the programmable ROM, are made High or Low depending on the internal control signals ce and oe, that is, the chip enable signal CE and the output enable signal OE. The programmable ROM is put in the program mode when the internal control signal ECE is make Low and the internal control signal EOE is made High, upon which 8-bit write data supplied via the data input/output terminals D0 through D7 are written to eight selected memory cells in the memory array MARY. When the internal control signal ECE is made High and the internal control signal EOE is made Low, the programmable ROM is put in the verify mode, upon which 8-bit read data from the eight selected memory cells in the memory array MARY are transmitted via the data input/output terminals D0 through D7. When both the internal control signals ECE and EOE are made High or Low, the programmable ROM is put in a disabled or unselected state to stop operating.

Referring to FIG. 17, when the microcomputer MCU is put in the PROM mode of 1M-bit type and the internal control signal T1 is made High, the internal control signals ECE and EOE, which provide the substantial activation control signals of the programmable ROM, are made Low and High respectively when both the internal control signals ce and pgm, or the chip enable signal CE and the programming signal PGM are made Low and the internal control signal oe, or the output enable signal OE is made High. Consequently, the 32KB programmable ROM is put in the program mode, upon which the 8-bit write data from the data input/output terminals D0 through D7 are written to the eight selected memory cells in the memory array MARY.

When both the internal control signals ce and oe are made Low and the internal control signal pgm is made High, the internal control signals ECE and EOE are made High and Low respectively. Consequently, the 32KB programmable ROM is put in the verify mode, upon which the 8-bit read data from the eight selected memory cells in the memory array MARY are transmitted via the data input/output terminals D0 through D7. When the internal control signals ce, oe, and pgm are in other combinations than mentioned above, both the internal control signals ECE and EOE go High, putting the programmable ROM in the disabled or unselected state.

Then, if the programmable ROM is constituted by a 48KB EPROM, the memory control circuit MC includes two AND gates AG6 and AG7 which receive the internal control signal ce and oe in a predetermined combination as shown in FIG. 4. One input terminal of the AND gate AG6 is supplied with a non-inverted signal of the internal control signal ce and other other input terminal with an inverted signal of the internal control signal oe. One input terminal of the AND gate AG7 is supplied with an inverted signal of the internal control signal ce and the other input terminal with a non-inverted signal of the internal control signal oe. Consequently, an output signal of the AND gate AG6 is selectively made High on condition that the internal control signal ce or the chip enable signal CE is made High and the internal control signal oe or the output enable signal OE is made Low. Conversely, an output signal of the AND gate AG7 is selectively made High on condition that the internal control signal ce is made Low and the internal control signal oe is made High.

The output signal of the AND gate AG6 is supplied to one input terminal of a NOR gate NOG1 and, at the same time, to the read/write circuit RWC through an inverter N3 and an output buffer EOB4 as the internal control signal EOE, which provides the substantial activation control signal of the programmable ROM. Likewise, the output signal of the AND gate AG7 is supplied to one input terminal of the NOR gate NOG1 and, at the same time, to the read/write circuit RWC through an inverter N4 and an output buffer EPB2 as the internal control signal EOE, which provides the substantial activation control signal of the programmable ROM. An output signal of the NOR gate NOG1 is supplied through an output buffer ECB4 to the read/write circuit RWC as the internal control signal ECE, which provides the substantial activation control signal of the programmable ROM. Control terminals of these output buffers ECB4, EOB4, and EPB2 are commonly supplied with the above-mentioned internal control signal T2.

An output terminal of the output buffer ECB4 is commonly connected to an output terminal of an output buffer ECB3. Output terminals of the output buffers EOB4 and EPB2 are commonly connected to output terminals of output buffers EOB3 and EPB1 respectively. An input terminal of the output buffer ECB3 is supplied with the internal control signal ce and input terminals of the output buffers EOB3 and EPB1 with the internal control signals oe and pgm respectively. Control terminals of the output buffers ECB3, OEB3, and EPB1 are commonly supplied with the above-mentioned internal control signal T1.

Consequently, as shown in FIG. 18, when the microcomputer is put in the PROM mode of 256K-bit type and the internal control signal T2 is made High, the internal control signals ECE, EOE, and EPGM, which provide the substantial activation control signal of the programmable ROM, are made Low, High, and Low respectively, when the internal control signal ce or the chip enable signal CE goes Low and the internal control signal oe or the output enable signal OE goes low. This puts the 48KB programmable ROM in the programing mode, allowing to write the 8-bit write data supplied via the data input/output terminals D0 through D7 to the eight selected memory cells in the memory array MARY.

When the internal control signal ce is made High and the internal control signal oe is made Low, the internal control signals ECE, EOE, and EPGM are made LOW, LOW, and High respectively. This puts the 48KB programmable ROM in the verify mode, upon which the 8-bit read data from the eight selected memory cells in the memory array MARY are transmitted via the data input/output terminals D0 through D7. If both the internal control signals ce and oe are made High or Low, the internal control signals ECE, EOE, and EPGM all go High, putting the programmable ROM in the disabled or unselected state.

Referring to FIG. 19, when the microcomputer is put in the PROM mode of 1M-bit type and the internal control signal T1 is made High, the internal control signals ECE, EOE, and EPGM goes High or Low depending on states of the corresponding internal control signals ce, oe, and pgm, or the chip enable signal CE, the output enable signal OE, and the programming signal PGM. The 48KB programmable ROM is put in the programming mode to write the 8-bit write data supplied via the data input/output terminals D0 through D7 to the eight selected memory cells in the memory array MARY when both the internal control signals ECE and EPGM are made Low and the internal control signal EOE is made High. When both the internal control signals ECE and EOE are made Low and the internal control signal EPGM is made High, the programmable ROM is put in the verify mode, upon which the 8-bit read data coming from the eight selected memory cells in the memory array MARY are transmitted via the data input/output terminals D0 through D7. When the internal control signals ECE and EOE are in other combinations than mentioned above, the programmable ROM is put in the disabled or unselected state, stopping its operation.

Figure 6:
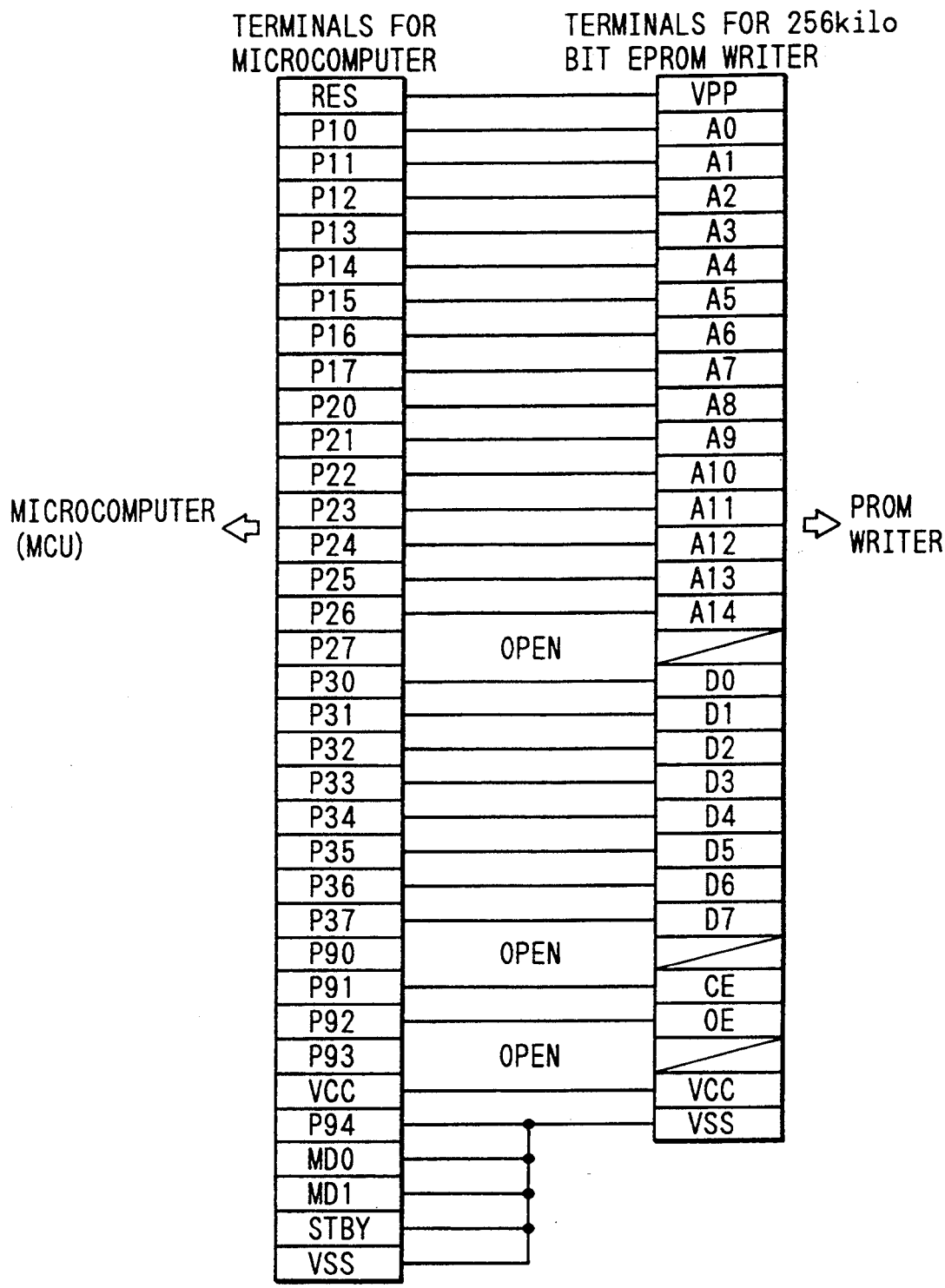
FIG. 6 is a connection diagram illustrating an embodiment of a socket adaptor of 256K-bit type used in the microcomputer incorporating the programmable ROM of FIG. 2.
Figure 7:
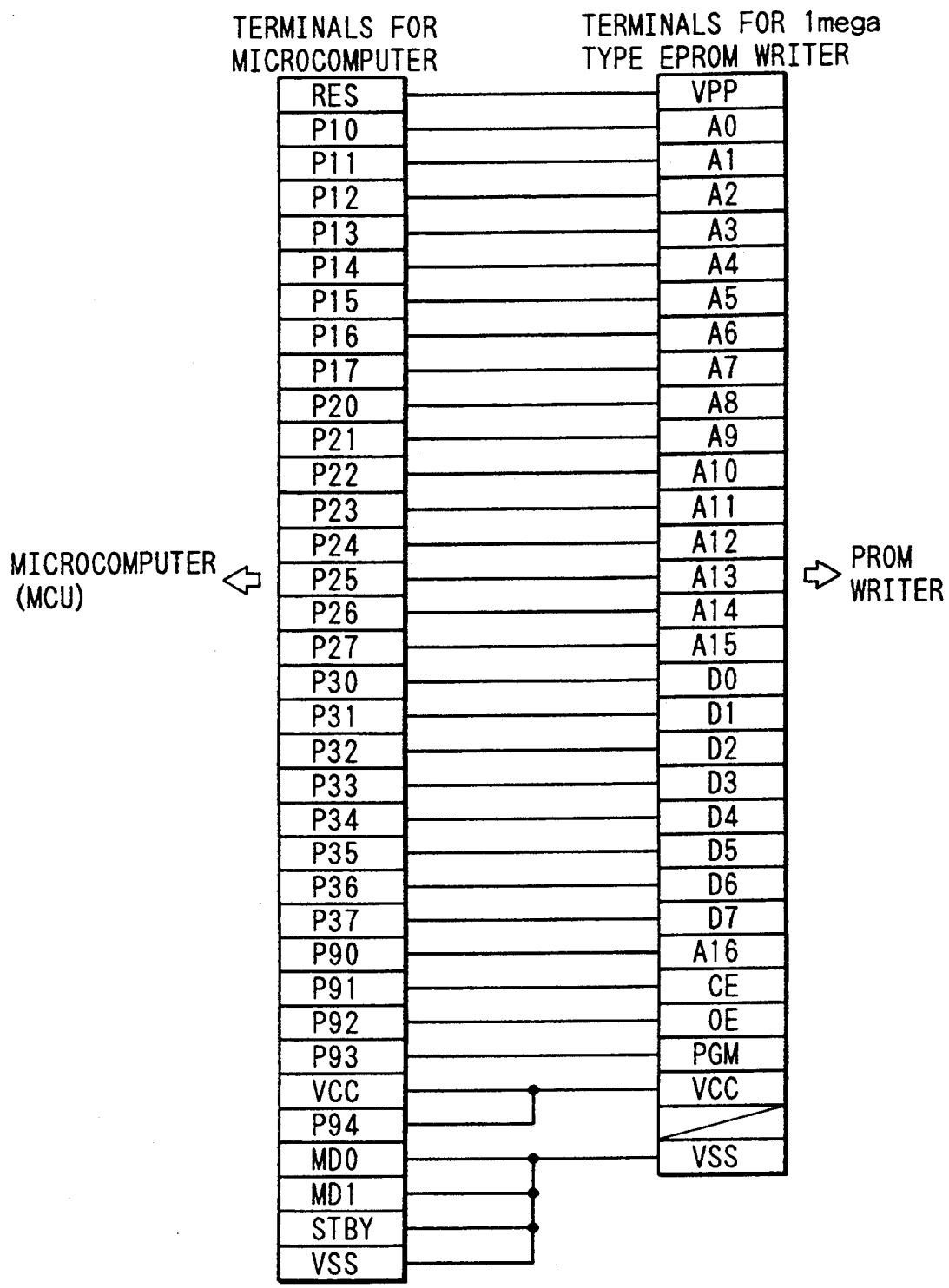
FIG. 7 is a connection diagram illustrating an embodiment of a socket adaptor of 1M-bit type used in the microcomputer incorporating the programmable ROM of FIG. 2.

FIG. 6 is a connection diagram of the embodiment of a 256K-bit socket adaptor to link the microcomputer to the ROM writer when the microcomputer is put in the PROM mode of 256K-bit type. FIG. 7 is a connection diagram of the embodiment of a 1M-bit socket adaptor to link the microcomputer to the ROM writer when the microcomputer is put in the PROM mode of 1M-bit type. Referring to these diagrams, the connection forms of the socket adaptors to be used in the PROM modes of the microcomputer practiced as the embodiment of the present invention and characteristics of each form will be described. It should be noted that the connection diagrams of the socket adaptors including FIGS. 6 and 7 are shown without microcomputer terminals not directly associated with the present invention.

Referring now to FIG. 6, the 256K-bit type socket adaptor provides a socket at one end for mounting a DIP-type 64-terminal microcomputer thereto and 28 external terminals at another end for connecting to the ROM writer. The number of the external terminals is the same as the number of 256K-bit EPROMs. The external terminals and the EPROMs are in the same alignment. Inside the socket adaptor, the terminals on socket side or microcomputer side are connected to the external terminals in a predetermined combination.

That is, a reset signal input terminal RES on the microcomputer side is connected to a write power supply terminal VPP on the ROM writer side. Terminals P10 through P17 of the input/output port P1 of the microcomputer are respectively connected to address input terminals A0 through A7 on the ROM writer side. Terminals P20 through P26 of the input/output port P2 of the microcomputer are respectively connected to address input terminals A8 through A14 on the ROM writer side. Terminals P30 through P37 of the input/output port P3 are respectively connected to data input/output terminals D0 through D7 on the ROM writer side. Terminals 91 and 92 of an input/output port P9 of the microcomputer are respectively connected to a chip enable signal input terminal CE and a output enable signal input terminal OE on the ROM writer side. A power supply terminal VCC on the microcomputer side is connected to a power supply terminal VCC on the ROM writer side. Further, a terminal P94 or the write control signal terminal CONT of the input/output port P9 on the microcomputer side is commonly connected to a ground terminal VSS along with mode control signal input terminals MD0 and MD1 and a standby signal input terminal STBY and is then connected to a ground terminal VSS on the ROM writer side. It should be noted that a terminal P27 of the input/output port P2 and terminals P90 through P93 of the input/output port P9 of the microcomputer are all put in an open state.

Consequently, the microcomputer is put in the PROM mode when the mode control signals MD0 and MD1 and the standby signal STBY all go Low like the ground VSS. And the PROM mode of 256K-bit is set when the write control signal CONT goes Low like the ground VSS. This allows the microcomputer to have the same interface as the 256K-bit EPROM, write the programmable ROM or execute a program under control of the general-purpose ROM writer, and execute a read operation to verify whether the writing operation has been performed normally or not.

Referring to FIG. 7, the 1M-bit type socket adaptor is formed at one of its ends into a socket for mounting the DIP-type 64-terminal microcomputer thereto and has at another end 32 external terminals for connection with the socket of the ROM writer. The number of external terminals is the same as the number of 1M-bit EPROMs. The external terminals and the 1M-bit EPROMs are in the same alignment. Inside the socket adaptor, the terminals on the socket side or the microcomputer side are connected to the external terminals on the ROM writer side in a predetermined combination.

That is, a reset signal input terminal RES on the microcomputer side is connected to a write power supply terminal VPP on the ROM writer side. Terminals P10 through P17 of the input/output port P1 of the microcomputer are respectively connected to address input terminals A0 through A7 of the ROM writer. Terminals P20 through P27 of the input/output port P2 of the microcomputer are respectively connected to address input terminals A8 through A15 of the ROM writer. Terminals 30 through 37 of the input/output port P3 are respectively connected to data input/output terminals D0 through D7 of the ROM writer. Terminals P90 through P93 of the input/output port P9 of the microcomputer are respectively connected to an address input terminal A16, a chip enable signal input terminal CE, an output enable signal input terminal OE, and a programming signal input terminal PGM on the ROM writer side. A terminal 94 of the input/output port P9 of the microcomputer, or the write control signal input terminal CONT, is connected to a power supply terminal VCC of the microcomputer and then to a power supply terminal VCC on the ROM writer side. Mode control signal input terminals MD0 and MD1 and a standby signal input terminal STBY of the microcomputer are commonly connected to a ground terminal VSS of the microcomputer and then to a ground terminal VSS on the ROM writer side.

Consequently, the microcomputer is put in the PROM mode when the mode control signals MD0 and MD1 and the standby signal STBY all go Low. And, when the write control signal CONT goes low like the power voltage VCC, the PROM mode becomes 1M-bit type. This allows the microcomputer to have the same interface as the 1M-bit EPROM, write the programmable ROM or execute a program under control of the general-purpose ROM writer, and execute a read operation to verify whether the writing operation has been performed normally or not.

Thus, the microcomputer practiced as the embodiment of the present invention has the write control signal for selectively specifying one of the writing schemes in the PROM mode and has a capability of selectively switching between the numbers and combinations of the address signals and activation control signals of the on-chip programmable ROM according to the write control signal CONT. Moreover, the microcomputer practiced as the embodiment of the present invention is compatible with both the 256K-bit and 1M-bit type writing schemes regardless of the storage size of the on-chip programmable ROM and can be connected through the appropriate predetermined socket adaptor to the general-purpose ROM writer to read/write the programmable ROM. This allows users to write on-chip programmable ROMs without being aware of their storage sizes and facilitates migration of technological know-how accumulated between microcomputers incorporating programmable ROMs of different storage sizes. As a result, users' technological burden will be mitigated and functionality and systems flexibility of the single-chip microcomputer incorporating the programmable ROM will be enhanced and development period of a system containing such a microcomputer and the number of design and evaluation processes will be reduced.

As indicated by the above-mentioned embodiment, applying the present invention to the single-chip microcomputer incorporating the programmable ROM and has the PROM mode for writing it provides following effects:

(1) The single-chip microcomputer or the like compatible with a plurality of on-chip programmable ROM writing schemes is implemented regardless of types and storage sizes of on-chip programmable ROMs incorporated therein by providing the above-mentioned single-chip microcomputer or the like with the write control signal for selectively specifying one of the writing schemes in the PROM mode and the capability of selectively switching between the numbers and/or combinations of the address signals and activation control signals supplied to the on-chip programmable ROMs according to the above-mentioned write control signal;

(2) As a result of (1) above, users' technological burden is mitigated;

(3) Again as a result of (1) above, functionality and systems flexibility of the single-chip microcomputer or the like incorporating the programmable ROM is enhanced; and (4) As a result of (1) through (3) above, a reduction is attained in both development period of systems incorporating the single-chip microcomputer and the number of design and evaluation processes of the systems.

While the described embodiments represent the preferred form of the present invention, it is to be understood that modifications will occur to those skilled in the art without departing from the spirit of the invention. The scope of the invention is therefore to be determined solely by the appended claims. Referring to FIG. 1, for example, the single-chip microcomputer may take any block configuration. Moreover, names and uses of the external terminals of each input/output port are not restricted by the present embodiment. It is also possible for the write control signal CONT to be provided as a part of any of the mode control signal. Combinations of the activation control signals for specifying the microcomputer PROM modes and writing schemes may take various embodiments.

Figure 10:
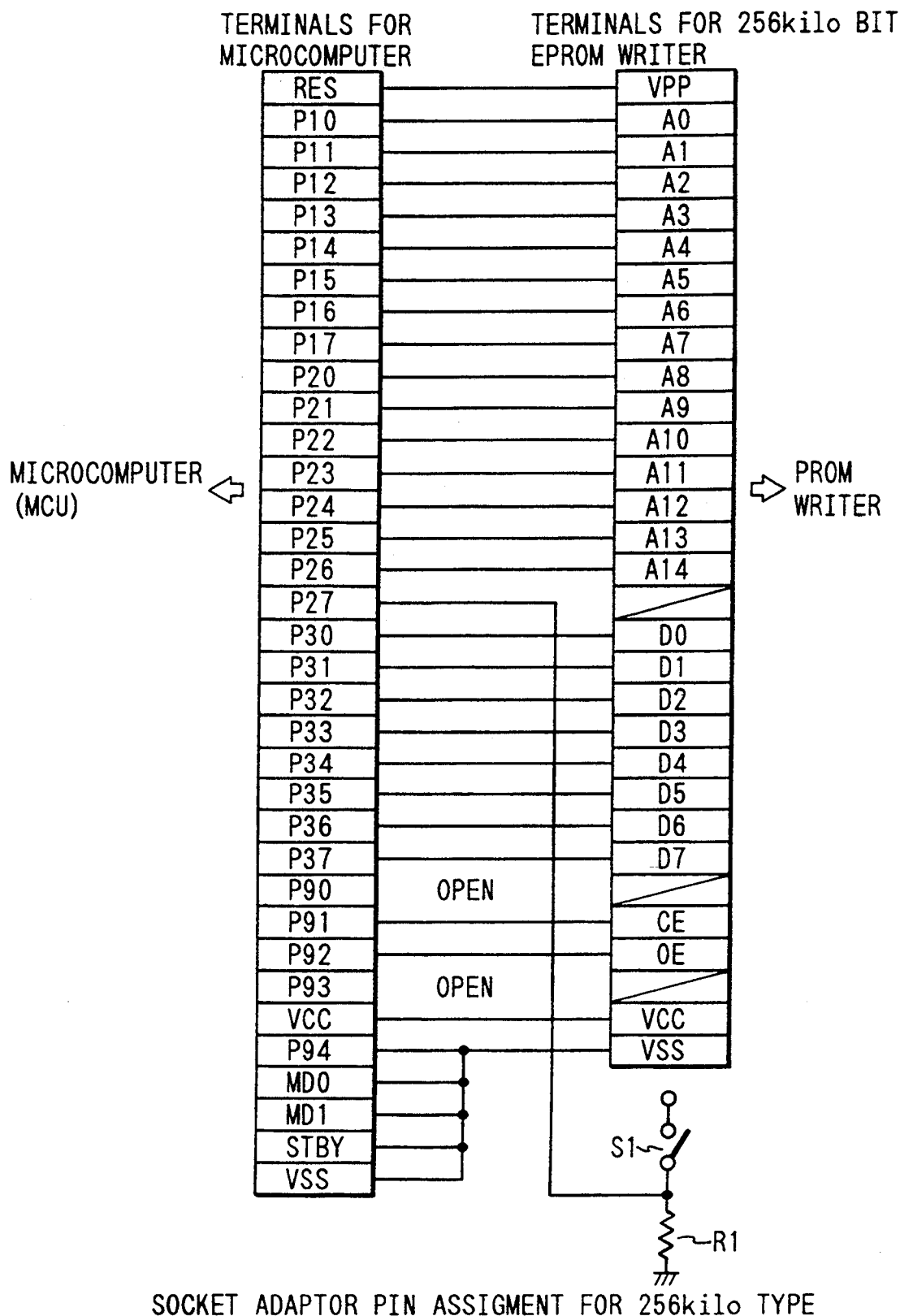
FIG. 10 is a connection diagram illustrating an embodiment of a socket adaptor of 256K-bit type used in the microcomputer incorporating the programmable ROM of FIG. 8.

Storage sizes of the programmable ROM and its read/write control methods can be set without restriction. It will be appreciated that the programmable ROM can also be constituted by such programmable storage means as an EEPROM (Electrically Erasable and Programmable ROM) or a flash type EEPROM device. When the programmable ROM is constituted by the EEPROM, the 1M-bit writing type or the 256K-bit writing type can be selectively specified by means of the write control signal CONT by way of example. The write control signal also allows to selectively make valid an erase enable signal EE of the EEPROM. If the EPROM and the EEPROM are compatible with each other in terminal assignment, providing switching means as shown in FIG. 10 to be described later can selectively specify a logic level of the write control signal CONT and, eventually, a type of the programmable ROM to be incorporated in the microcomputer. Referring to FIG. 2, the memory control circuit MC can be contained in a prestage circuit of the programmable ROM. And a block configuration of the programmable ROM may take various embodiments.

Figure 8:
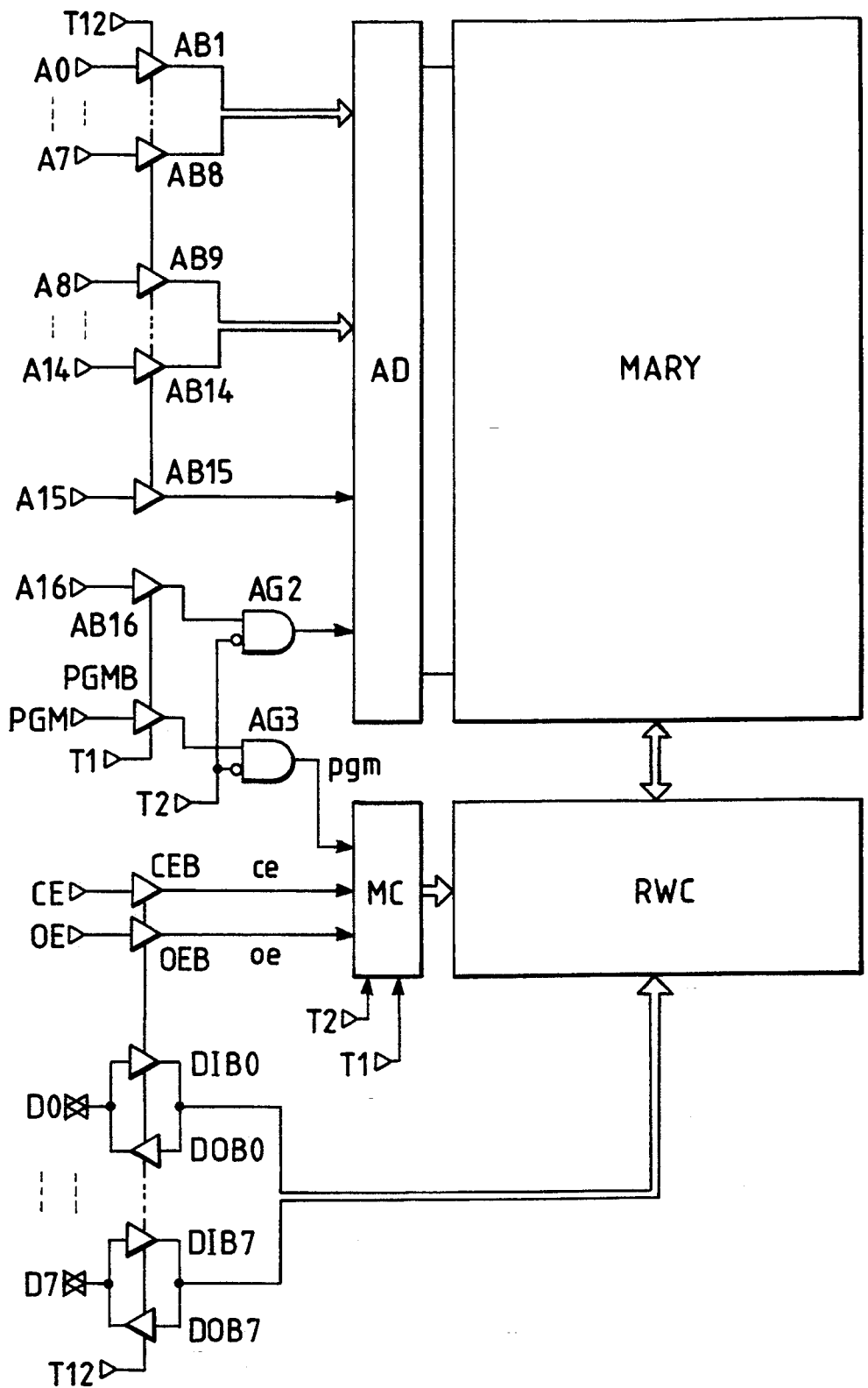
FIG. 8 is a block diagram illustrating a second embodiment of the programmable ROM incorporated in the microcomputer of FIG. 1.
Figure 9:
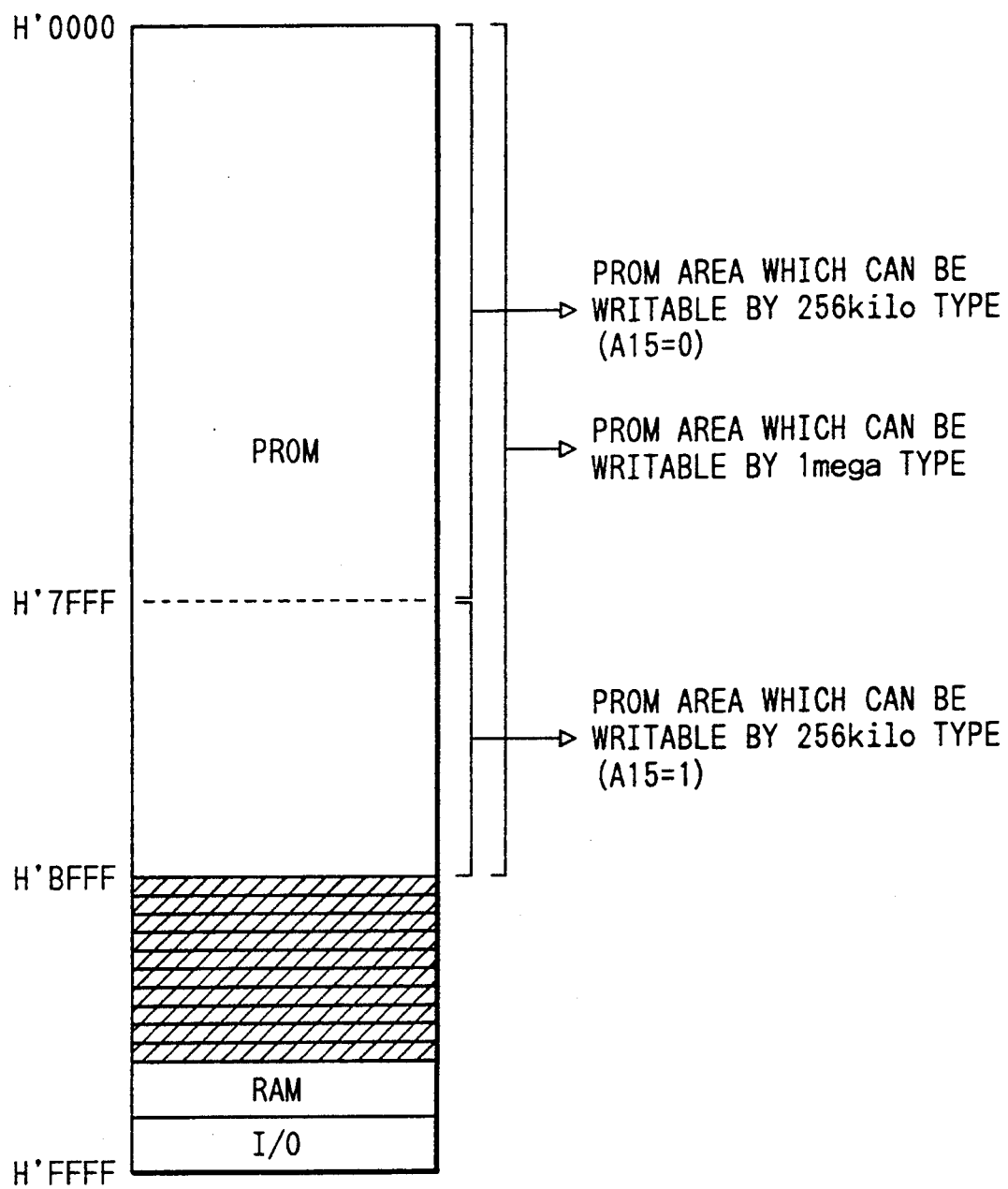
FIG. 9 is an address assignment diagram illustrating an embodiment of a microcomputer incorporating the programmable ROM of FIG. 8.

With the embodiment of FIG. 2 to FIG. 7, if the programmable ROM is constituted by the 48KB EPROM and the microcomputer is put in the PROM mode of 256K-bit type, a programmable ROM address area accessible by the ROM writer is up to address H'7FFF. However, as shown in FIG. 8, transmitting the address signal A15 to the address decoder AD through the input buffer AB15 which receives the internal control signal T12 at its control terminal allows the ROM writer to access all address areas of the programmable ROM. In this case, referring to FIG. 10, terminal P27 of the input/output port P2 to which the address signal A15 is applied is connected to a power voltage VCC (first power voltage) through a switch S1 (switch means) in a socket adaptor of 256K-bit type and to a ground VSS (second power voltage) through a resistor R1. When the switch S1 is opened or closed, the address signal A15 is selectively made Low or High. It will be appreciated that the microcomputer can access addresses H'0000 to H'7FFF of the programmable ROM when the switch S1 is turned off to make the address signal A15 go Low; it can access addresses H'7FFF to H'BFFF when the switch S1 is turned on to make the address signal A15 go High.

Figure 11:
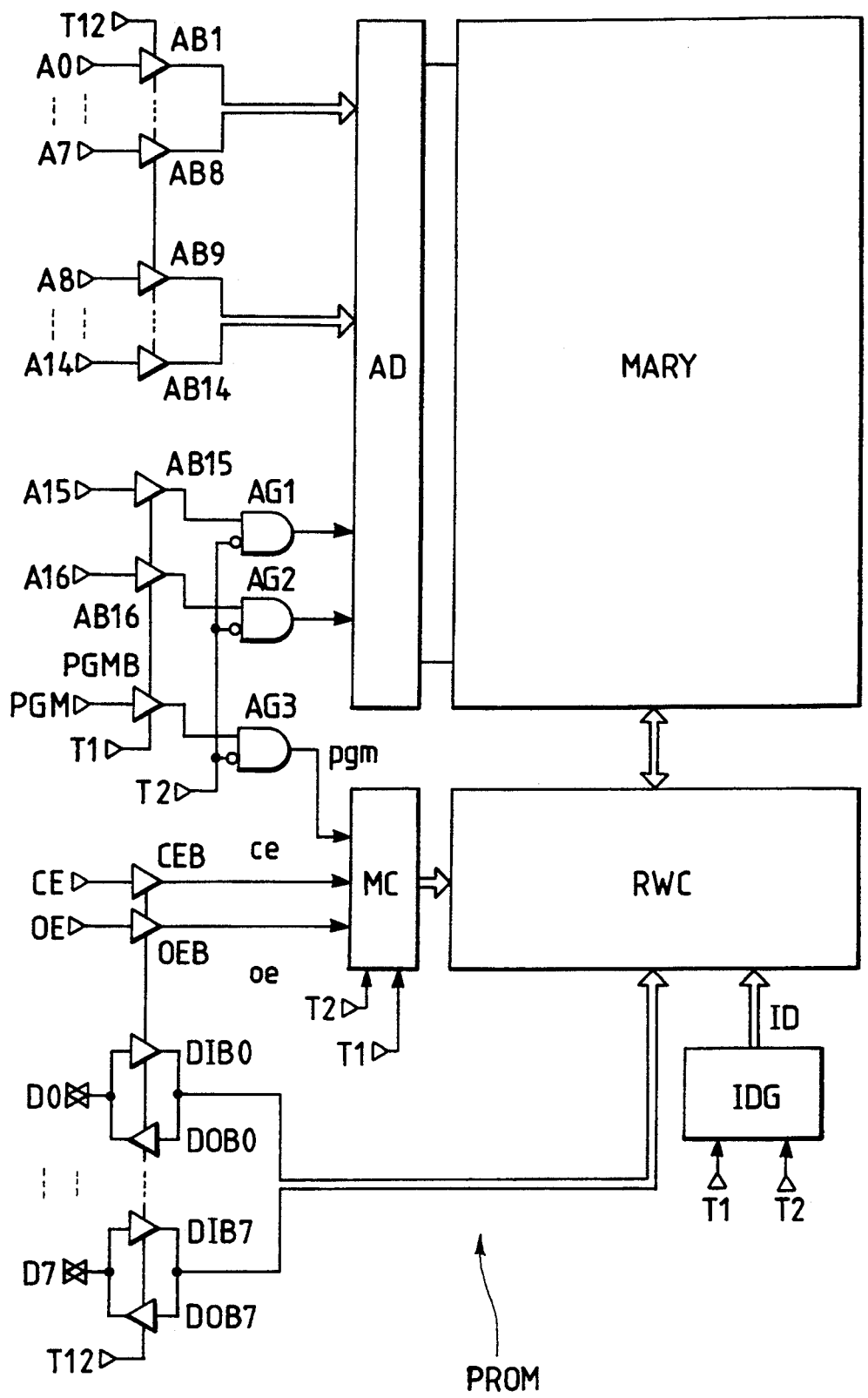
FIG. 11 is a block diagram illustrating a third embodiment of the programmable ROM incorporated in the microcomputer of FIG. 1.

Now, referring to FIG. 11, the programmable ROM is provided with an identification code generating circuit IDG which indicates in which type of the writing schemes the programmable ROM is set, especially when the writing scheme is fixed inside it. In this case, although not limitative of, the microcomputer is selectively put in an identification code output mode when a chip enable signal CE and an output enable signal OE go Low and a write voltage VPP is applied to an address input terminal A9. In the identification code output mode, the identification code generating circuit IDG generates a predetermined identification code ID according to internal control signals T1 and T2 to send the generated code outside the microcomputer from a read/write circuit RWC through output buffers DOB0 through DOB7 and data output terminals D0 through D7. This allows the user to identify the writing scheme of the microcomputer and select the types of the socket adaptor and the ROM writer without error.

The programmable ROM may be provided with a page programming mode in which stored data of four bytes for example can be simultaneously programmed. In this case, as shown in FIG. 20, the microcomputer is put in a page data latch mode when both the chip enable signal CE and programming signal PGM go High and the output enable signal OE goes Low, upon which the 4-byte stored data are captured in a data latch. The microcomputer is put in the page programming mode when both the chip enable signal CE and output enable signal OE go High and the programming signal PGM goes Low, upon which the 4-byte data held in the data latch are simultaneously written to selected 32 memory cells.

Figure 12:
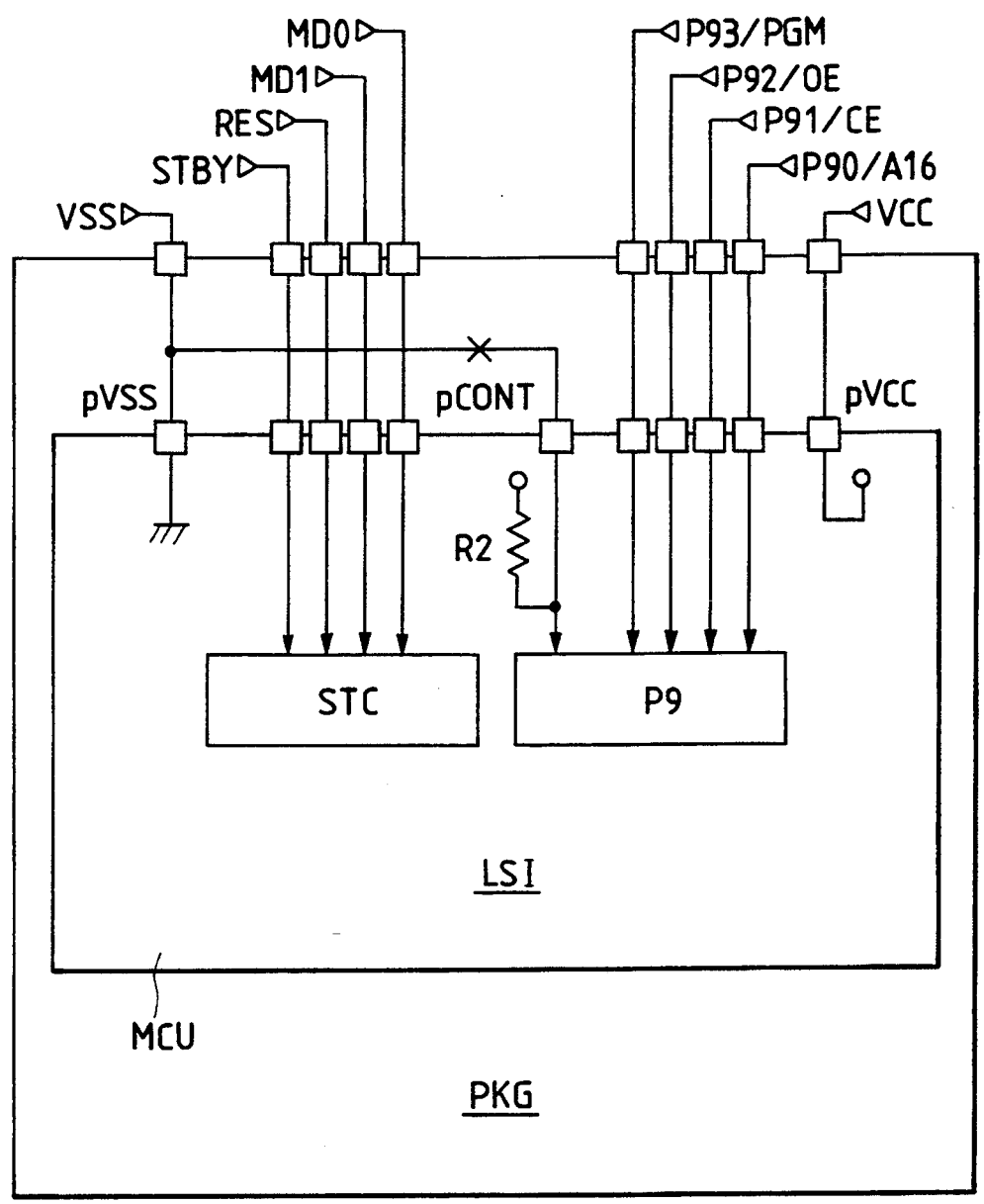
FIG. 12 is a block diagram illustrating a second embodiment of the single-chip microcomputer according to the present invention.
Figure 13:
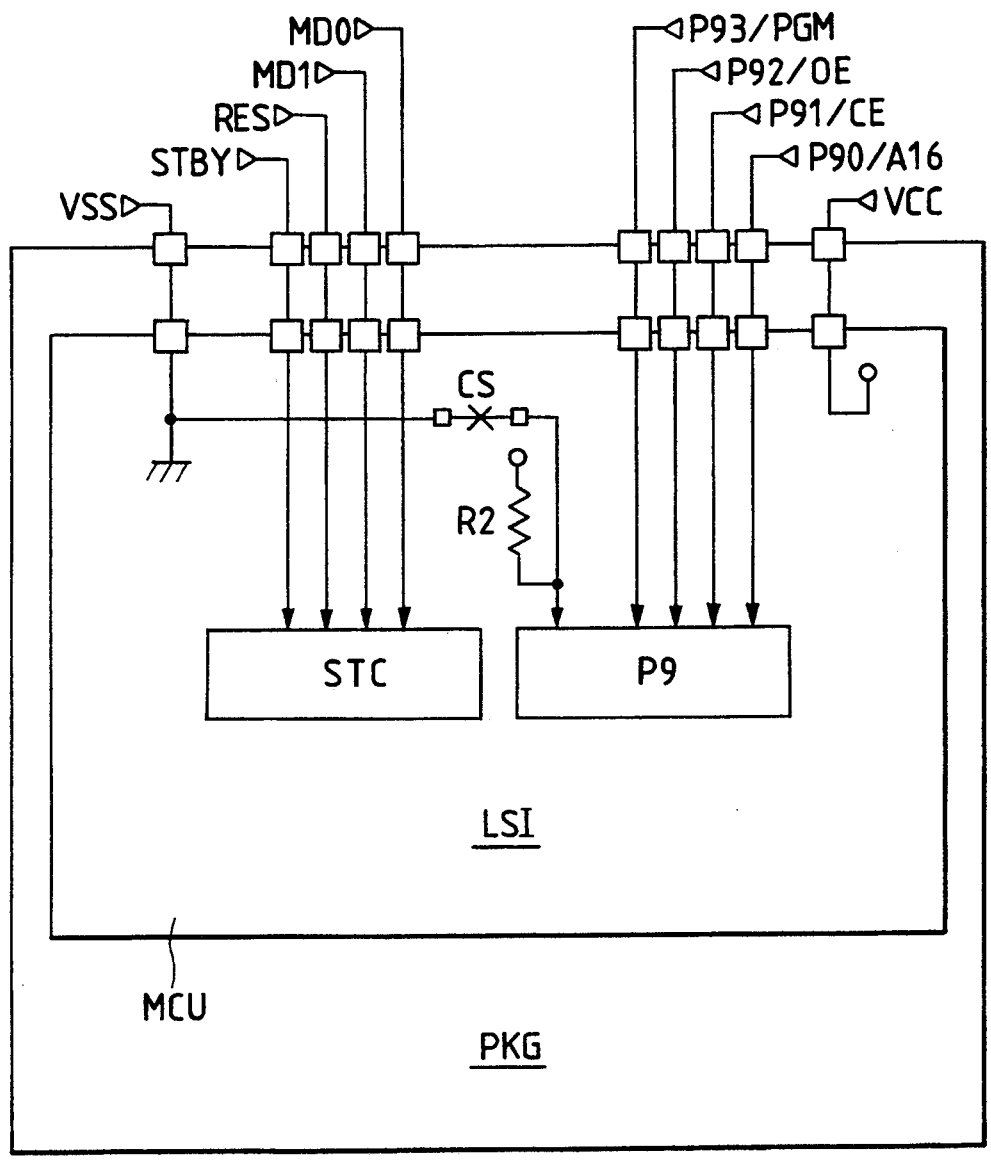
FIG. 13 is a block diagram illustrating a third embodiment of the single-chip microcomputer according to the present invention.

Although, in the above-mentioned embodiment, the write control signal CONT for selectively specifying the writing scheme of the microcomputer is supplied from outside the microcomputer, a bonding may be provided to selectively connect a predetermined pad pCONT of a large-scale integration (LSI) chip comprising the microcomputer to a ground supply pad pVSS as shown in FIG. 12. Alternatively, as shown in FIG. 13, a metal wiring layer provided between the input/output port P9 corresponding to the write control signal CONT and the ground VSS, or connection switch CS, may be selectively formed by modifying a photo mask. In the case of FIG. 12, a predetermined pull-up resistor R2 is required between the input terminal for the write control signal CONT of the input/output port P9 and the supply voltage VCC. In the case of FIG. 13, the pull-up resistor R2 may be put in an unconnected state by means of the metal wiring layer. It will be appreciated that level switching of the write control signal CONT as shown in FIG. 13 may implemented with no pull-up resistor by selectively forming the metal wiring layer between the corresponding input terminal of the input/output port P9 and the supply voltage VCC or ground VSS.

Figure 14:
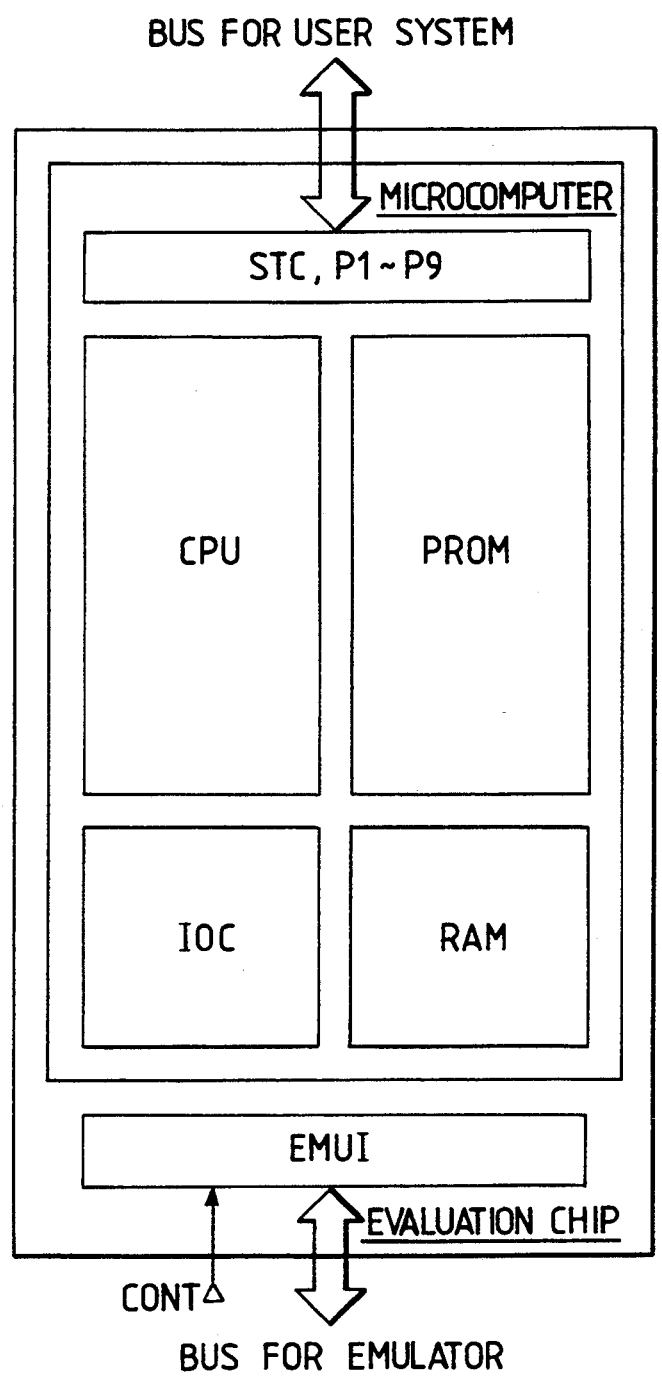
FIG. 14 is a block diagram illustrating a fourth embodiment of the single-chip microcomputer according to the present invention.

If an emulation processor is necessary for evaluating the above-mentioned microprocessor, an emulation interface EMUI may be formed on a semiconductor substrate formed with the microcomputer, providing an evaluation chip as shown in FIG. 14. In this case, an external emulator can be connected to the microcomputer through the emulation interface EMUI to supply the write control signal CONT also from the emulator. If the emulation processor has a capability of selecting a microcomputer to be emulated, the write control signal CONT may be automatically generated by means of a control signal for such selection.

It will be further appreciated that the specific circuit configurations of the memory control circuits MCs as shown in FIGS. 3 and 4 and the number of terminals, terminal assignments, supply voltage polarities and absolute values of the socket adaptors as shown in FIGS. 6, 7, and 10 may take various other embodiments.

Thus, we have described our invention mainly in the case where it is applied to the single-chip microcomputer whose utilization field provided a background for our invention. However, application of our invention is not limited to the single-chip microcomputer alone; it is widely applicable to those semiconductor devices which comprise at least programmable storage means.

Briefly, typical embodiments of the invention provide the following effects. That is, the single-chip microcomputer or the like incorporating the programmable ROM is provided with the write control signal for selectively specifying one of the writing schemes in the PROM mode to provide the capability of selectively switching the numbers and/or combinations of the address signals and/or activation control signals to be supplied to the programmable ROM according to the above-mentioned write control signal, implementing a single-chip microcomputer or the like that is compatible with a plurality of programmable ROM writing schemes regardless of type and storage size of the on-chip programmable ROM. This mitigates user's technological burden, enhances functionality and systems flexibility of the single-chip microcomputer or the like incorporating the programmable ROM, and reduces development period and the number of design and evaluation steps of a system comprising the microcomputer.

What is claimed is:

1. A semiconductor device comprising:
   address terminals where address signals are to be supplied;
   data terminals where data is to be supplied;
   control terminals where control signals are to be supplied, the control signals including a write mode control signal having a first level which specifies a first write mode and a second level which specifies a second write mode;
   address buffer circuits coupled to the address terminals, ones of the address buffer circuits being operated in the first and the second write mode while the remaining address buffer circuit is operated in the second write mode;
   control buffer circuits coupled to the control terminals, ones of the control buffer circuits being operated in the first and the second write mode while the remaining control buffer circuit is operated in the second write mode;
   address decoder coupled to receive output signals supplied from the operated address buffer circuits to decode the output signals;
   a control circuit coupled to receive output signals supplied from the operated control buffer circuits;
   a memory array including a plurality of memory cells, ones of the memory cells being selected by the address decoder; and
   a write circuit coupled to the selected memory cells, the write circuit being responsive to outputs of the control circuit and writing the data supplied to the data terminals to the selected memory cells.

2. A semiconductor device according to claim 1, wherein the plurality of memory cells each includes an MOS memory cell of a floating gate type.

3. A semiconductor device according to claim 2, further including a read circuit coupled to the selected memory cells, the read circuit being responsive to the outputs of the control circuit and reading data stored in the selected memory cells to the data terminals to verify the data written into the selected memory cells by the write circuit in the first or the second write mode.

4. A single-chip microcomputer including an electrically programmable read only memory capable of storing a predetermined program therein and a central processing unit coupled to the electrically programmable read only memory and for executing the predetermined program stored in the electrically programmable read only memory in a predetermined mode, the single-chip microcomputer having a programming mode for the electrically programmable read only memory so as to program data for the predetermined program into the electrically programmable read only memory, the single-chip microcomputer comprising:
   an external terminal for a write mode control signal having one of a first and second level, where the first level specifies a first mode in the programming mode, and where the second level specifies a second mode in the programming mode;
   external address terminals for address signals capable of utilizing in the programming mode;
   external data terminals where the data is to be supplied in the programming mode;
   the electrically programmable read only memory including:
      address buffer circuits coupled to the external address terminals in the programming mode, ones of the address buffer circuits being operated in the first and the second mode while the remaining address buffer circuit is operated in the second mode;
      control buffer circuits coupled to the external control terminals in the programming mode, ones of the control buffer circuits being operated in the first and the second write mode while the remaining control buffer circuit is operated in the second write mode;
      address decoder coupled to receive output signals supplied from the operated address buffer circuits to decode the output signals;
      a control circuit coupled to receive output signals supplied from the operated control buffer circuits;
      a memory array including a plurality of memory cells, ones of the memory cells being selected by the address decoder; and
      a write circuit coupled to the selected memory cells, the write circuit being responsive to outputs of the control circuit and writing the data supplied to the data terminals to the selected memory cells.

5. A single-chip microcomputer according to claim 4, wherein the plurality of memory cells each includes an MOS memory cell of a floating gate type.

6. A single-chip microcomputer according to claim 5, further including a read circuit coupled to the selected memory cells, the read circuit being responsive to the outputs of the control circuit and reading data stored in the selected memory cells to the data terminals to verify the data written into the selected memory cells by the write circuit in the programming mode.

7. A microcomputer on a single semiconductor substrate comprising:
   a central processing unit for executing a predetermined program in a predetermined operating mode; and
   an electrically programmable read only memory coupled to the central processing unit in the predetermined operating mode and providing the predetermined program stored therein in response to access from the central processing unit, the EPROM being programmed with data constituting the predetermined program therein when the microcomputer is in a programming mode, wherein the EPROM includes a plurality of memory cells, address decoder selecting ones of the plurality of memory cells in accordance with address signals supplied thereto, a read and write circuit coupled to the selected memory cells, and a control circuit controlling operation of the read and write circuit in accordance with control signals supplied thereto;

external address terminals for external address signals capable of utilizing in the programming mode, the external address signals being selectively supplied to the address decoder as the address signals;

external data terminals where the data is to be supplied in the programming mode;

external control terminals for external control signals capable of utilizing in the programming mode, the external control signal being selectively supplied to the control circuit as the control signals; and a circuit receiving a write mode control signal and setting a first or a second mode in the programmable mode, wherein the address decoder receives the address signals based on ones of the external address signals in the first mode, and wherein the address decoder receives the address signals based on the external address signals in the second mode.

8. A microcomputer according to claim 7, wherein the EPROM further includes address buffer circuits coupled among the external address terminals and inputs of the address decoder in the programming mode, wherein ones of the address buffer circuits are operated in the first mode, and wherein all the address buffer circuits are operated in the second mode.

9. A microcomputer according to claim 8, wherein the control circuit receives the control signals based on ones of the external control signals in the first mode, and wherein the control circuit receives the control signals based on the external control signals in the second mode.

10. A microcomputer according to claim 9, wherein the EPROM further includes control buffer circuits coupled among the external control terminals and inputs of the control circuit in the programming mode, wherein the control circuit receives the control signals based on ones of the external control signals in the first mode, and wherein the control circuit receives the control signals based on the external control signals in the second mode.

11. A microcomputer according to claim 7, further comprising:

an external terminal receiving the write mode control signal in the programming mode.

12. A microcomputer according to claim 7, wherein the plurality of memory cells each includes an MOS memory cell of a floating gate type.

13. A microcomputer on a single semiconductor substrate comprising:

a central processing unit for executing a predetermined program in a predetermined operating mode; and an electrically programmable read only memory coupled to the central processing unit in the predetermined operating mode and providing the predetermined program stored therein in response to access from the central processing unit, the EPROM being programmed with data constituting the predetermined program therein when the microcomputer is in a programming mode, wherein the EPROM includes a plurality of memory cells, address decoder selecting ones of the plurality of memory cells in accordance with address signals supplied thereto, a read and write circuit coupled to the selected memory cells, and a control circuit controlling operation of the read and write circuit in accordance with control signals supplied thereto;

external address terminals for external address signals capable of utilizing in the programming mode, the external address signals being selectively supplied to the address decoder as the address signals;

external data terminals where the data is to be supplied in the programming mode;

external control terminals for external control signals capable of utilizing in the programming mode, the external control signals being selectively supplied to the control circuit as the control signals; and a circuit receiving a write mode control signal and setting a first or a second mode in the programming mode, wherein the control circuit receives the control signals based on ones of the external control signals in the first mode, and wherein the control circuit receives the control signals based on the external control signals in the second mode.

14. A microcomputer according to claim 13, wherein the EPROM further includes control buffer circuits coupled among the external control terminals and inputs of the control circuit in the programming mode, wherein the control circuit receives the control signals based on ones of the external control signals in the first mode, and wherein the control circuit receives the control signals based on the external control signals in the second mode.

15. A microcomputer according to claim 14, wherein the address decoder receives the address signals based on ones of the external address signals in the first mode, and wherein the address decoder receives the address signals based on the external address signals in the second mode.

16. A microcomputer according to claim 15, wherein the EPROM further includes address buffer circuits coupled among the external address terminals and inputs of the address decoder in the programming mode, wherein ones of the address buffer circuits are operated in the first mode, and wherein all the address buffer circuits are operated in the second mode.

17. A microcomputer according to claim 13, further comprising:

an external terminal receiving the write mode control signal in the programming mode.

18. A microcomputer according to claim 13, wherein the plurality of memory cells each includes an MOS memory cell of a floating gate type.

19. A single-chip microcomputer including an electrically programmable read only memory capable of storing a predetermined program therein and a central processing unit coupled to the electrically programmable read only memory and for executing the predetermined program stored in the electrically programmable read only memory in a predetermined mode, the single-chip microcomputer having a programming mode for the electrically programmable read only memory so as to program data for the predetermined program into the electrically programmable read only memory, the single chip microcomputer comprising:

an external terminal for a write mode control signal having one of a first and second level, wherein the first level specifies a first mode in the programming mode, and where the second level specifies a second mode in the programming mode;

three external control terminals;

the electrically programmable coupled to the three external control terminals in the programming mode, ones of the control buffer circuits being operated in the first and the second write mode while the remaining control buffer circuit is operated in the second write mode;

a plurality of memory cells;

address decoder responsive to address signals and selecting ones of the plurality of memory cells;

a read and write circuit coupled to the selected memory cells;

a control circuit coupled to receive output signals supplied from the operated control buffer circuits and controlling operations of the read and write circuit, wherein the control circuit is responsive to two control signals supplied from the operated buffer circuits in the first mode and operates the read and write circuit in a programming or a verify mode in accordance with combination on the two control signals, and wherein the control circuit is responsive to three control signals supplied from the operated buffer circuits in the second mode and operates the read and write circuit in a programming or a verify mode in accordance with combination of the three control signals.

20. A microcomputer according to claim 19, wherein the plurality of memory cells each includes an MOS memory cell of a floating gate type.

21. A method of writing to a programmable read only memory comprising the steps of:

receiving address signals into a plurality of address terminals;

receiving control signals into a plurality of control terminals, the control signals including a write mode control signal having a first level which specifies a first write mode and a second level which specifies a second write mode;

selectively operating a first address buffer circuit, coupled to the address terminals, in the first and second write modes;

selectively operating a second address buffer circuit, coupled to the address terminals, in the second write mode;

selectively operating a first control buffer circuit, coupled to the control terminals, in the first and second write modes;

selectively operating a second control buffer circuit, coupled to the control terminals, in the second write mode;

receiving output signals, supplied from an operated address buffer circuit, into an address decoder;

decoding, in the address decoder, output signals received therein;

receiving output signals, supplied from an operated control buffer circuit, into a control circuit;

selecting a plurality of memory cells of a memory array in accordance with an output of the address decoder; and writing data supplied by the data terminals, via a write circuit coupled to selected memory cells, to selected memory cells.

22. A semiconductor device according to claim 1 wherein the control signals include a program signal (PGM), an output enable signal (OE) and a chip enable signal (CE), and wherein the first mode is specified by control signals OE and CE, and wherein the second mode is specified by the control signals OE, CE and PGM.

23. A semiconductor device according to claim 4 wherein the control signals include a program signal (PGM), an output enable signal (OE) and a chip enable signal (CE), and wherein the first mode is specified by control signals OE and CE, and wherein the second mode is specified by the control signals OE, CE and PGM.

24. A semiconductor device according to claim 7 wherein the control signals include a program signal (PGM), an output enable signal (OE) and a chip enable signal (CE), and wherein the first mode is specified by control signals OE and CE, and wherein the second mode is specified by the control signals OE, CE and PGM.

25. A semiconductor device according to claim 13 wherein the control signals include a program signal (PGM), an output enable signal (OE) and a chip enable signal (CE), and wherein the first mode is specified by control signals OE and CE, and wherein the second mode is specified by the control signals OE, CE and PGM.

26. A semiconductor device according to claim 19 wherein the control signals include a program signal (PGM), an output enable signal (OE) and a chip enable signal (CE), and wherein the first mode is specified by control signals OE and CE, and wherein the second mode is specified by the control signals OE, CE and PGM.

27. The method of claim 1 further comprising the step of generating the control signals, inclusive of a program signal (PGM), an output enable signal (OE) and a chip enable signal (CE), and wherein the first mode is specified by control signals OE and CE, and wherein the second mode is specified by the control signals OE, CE and PGM.

* * * * *